United States Patent
Takahashi et al.

(10) Patent No.: US 12,463,063 B2
(45) Date of Patent: Nov. 4, 2025

(54) SUBSTRATE CLEANING DEVICE

(71) Applicant: SCREEN HOLDINGS CO., LTD., Kyoto (JP)

(72) Inventors: Takuma Takahashi, Kyoto (JP); Tomoyuki Shinohara, Kyoto (JP); Junichi Ishii, Kyoto (JP); Kazuki Nakamura, Kyoto (JP); Takashi Shinohara, Kyoto (JP); Nobuaki Okita, Kyoto (JP); Yoshifumi Okada, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 101 days.

(21) Appl. No.: 18/579,208

(22) PCT Filed: Jun. 30, 2022

(86) PCT No.: PCT/JP2022/026392
§ 371 (c)(1),
(2) Date: Jan. 12, 2024

(87) PCT Pub. No.: WO2023/286635
PCT Pub. Date: Jan. 19, 2023

(65) Prior Publication Data
US 2024/0321598 A1 Sep. 26, 2024

(30) Foreign Application Priority Data
Jul. 15, 2021 (JP) ................. 2021-117423

(51) Int. Cl.
H01L 21/67 (2006.01)
B08B 1/12 (2024.01)
B08B 1/34 (2024.01)

(52) U.S. Cl.
CPC .......... H01L 21/67046 (2013.01); B08B 1/12 (2024.01); B08B 1/34 (2024.01)

(58) Field of Classification Search
CPC ................................. H01L 21/67046
See application file for complete search history.

(56) References Cited

U.S. PATENT DOCUMENTS 5,361,449 A 11/1994 Akimoto
2015/0027492 A1 1/2015 Takiguchi et al.
(Continued)

FOREIGN PATENT DOCUMENTS

JP 06-120184 A 4/1994
JP 2003-332287 A 11/2003
(Continued)

OTHER PUBLICATIONS

International Search Report mailed Sep. 13, 2022 in corresponding PCT International Application No. PCT/JP2022/026392.
(Continued)

Primary Examiner — Jason Y Ko
(74) Attorney, Agent, or Firm — OSTROLENK FABER LLP

(57) ABSTRACT

A substrate cleaning device includes a substrate holder, a lower-surface brush, a first liquid nozzle and a second liquid nozzle. The substrate holder holds a substrate in a horizontal attitude. The lower-surface brush is configured to be movable between a processing position for cleaning of the substrate and a waiting position that overlaps with the substrate held by the substrate holder in an up-and-down direction. Further, the lower-surface brush is configured to be rotatable about an axis extending in the up-and-down direction. The lower-surface brush cleans a lower surface of the substrate by coming into contact with the lower surface of the substrate. The first liquid nozzle discharges a cleaning liquid to a center portion of the lower-surface brush, at a
(Continued)

waiting position. The second liquid nozzle discharges a cleaning liquid to an end portion of the lower-surface brush, at the waiting position.

6 Claims, 17 Drawing Sheets

(56) References Cited

U.S. PATENT DOCUMENTS

| | | |
|---|---|---|
| 2018/0221925 A1 | 8/2018 | Ito et al. |
| 2024/0321598 A1 | 9/2024 | Takahashi et al. |

FOREIGN PATENT DOCUMENTS

| | | |
|---|---|---|
| JP | 5904169 B2 | 4/2016 |
| JP | 2017-34235 A | 2/2017 |
| JP | 2019-145687 A | 8/2019 |
| JP | 2020-17689 A | 1/2021 |
| JP | 2021-93427 A | 6/2021 |
| TW | I850692 B | 8/2024 |
| WO | WO 2021/053995 A1 | 3/2021 |

OTHER PUBLICATIONS

Taiwan Office Action, dated Jul. 8, 2025, issued in corresponding Taiwan Patent Application No. 113130596.

F I G. 3
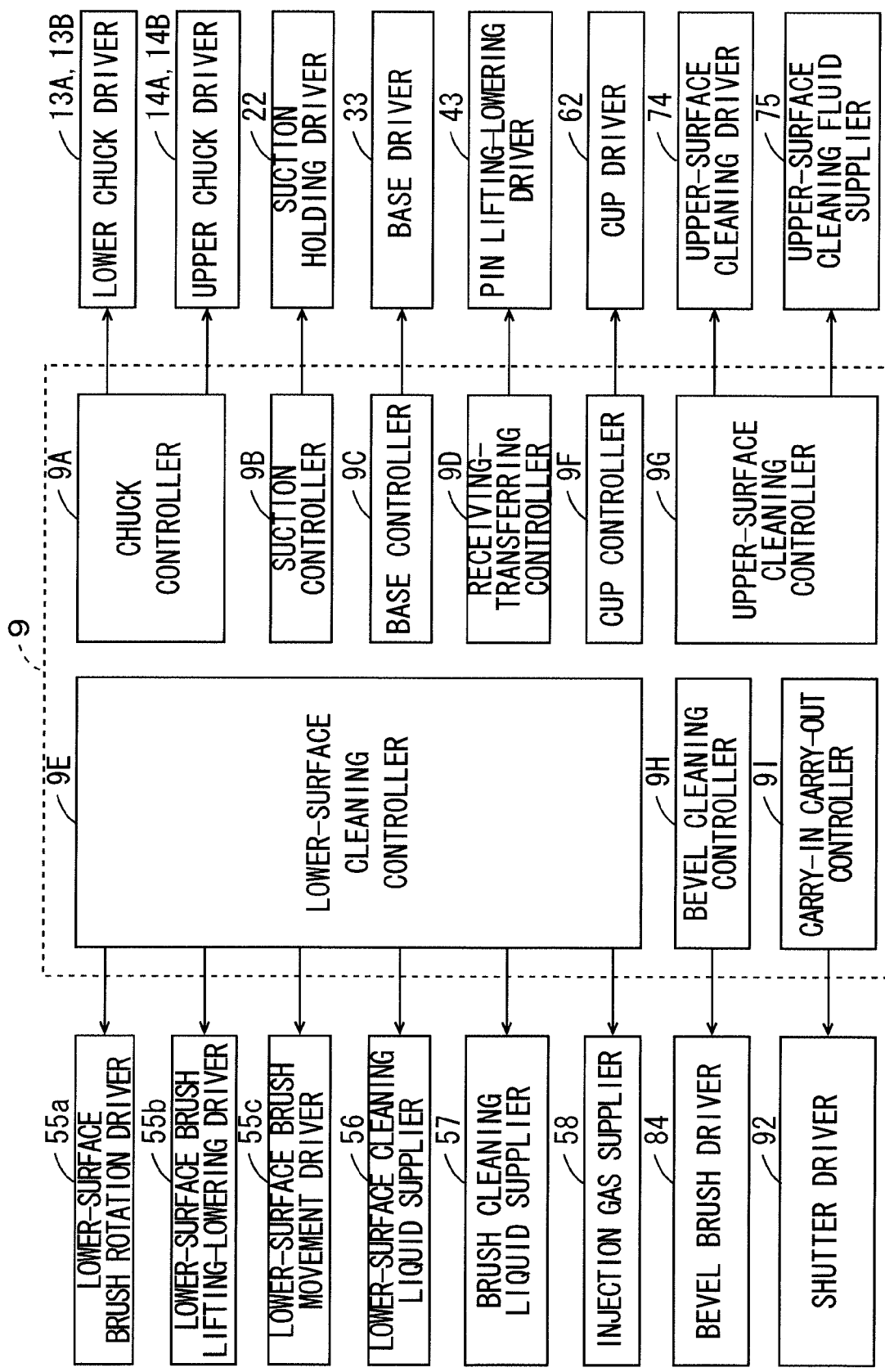

FIG. 4
PLAN VIEW
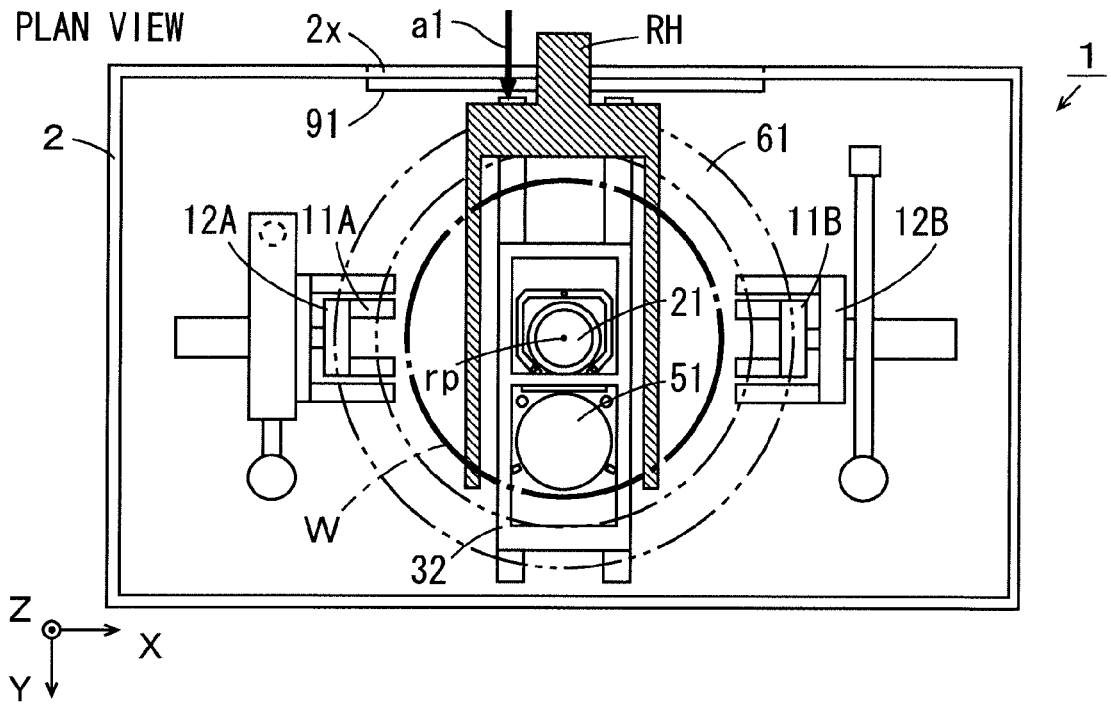
SIDE VIEW TAKEN ALONG LINE A-A
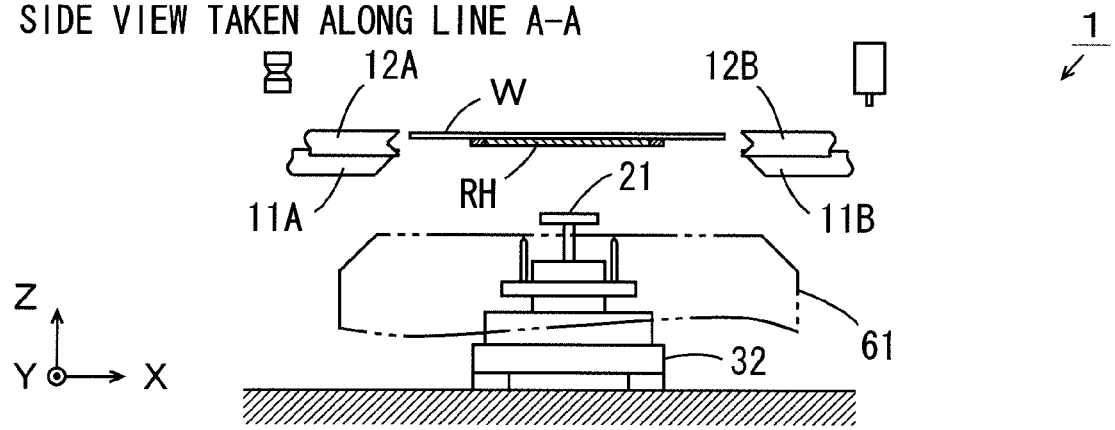
SIDE VIEW TAKEN ALONG LINE B-B
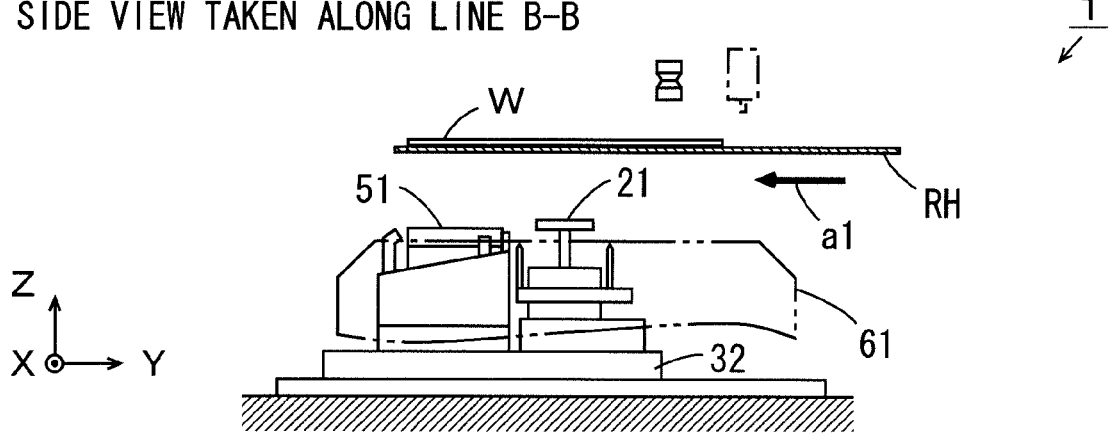

FIG. 5
PLAN VIEW
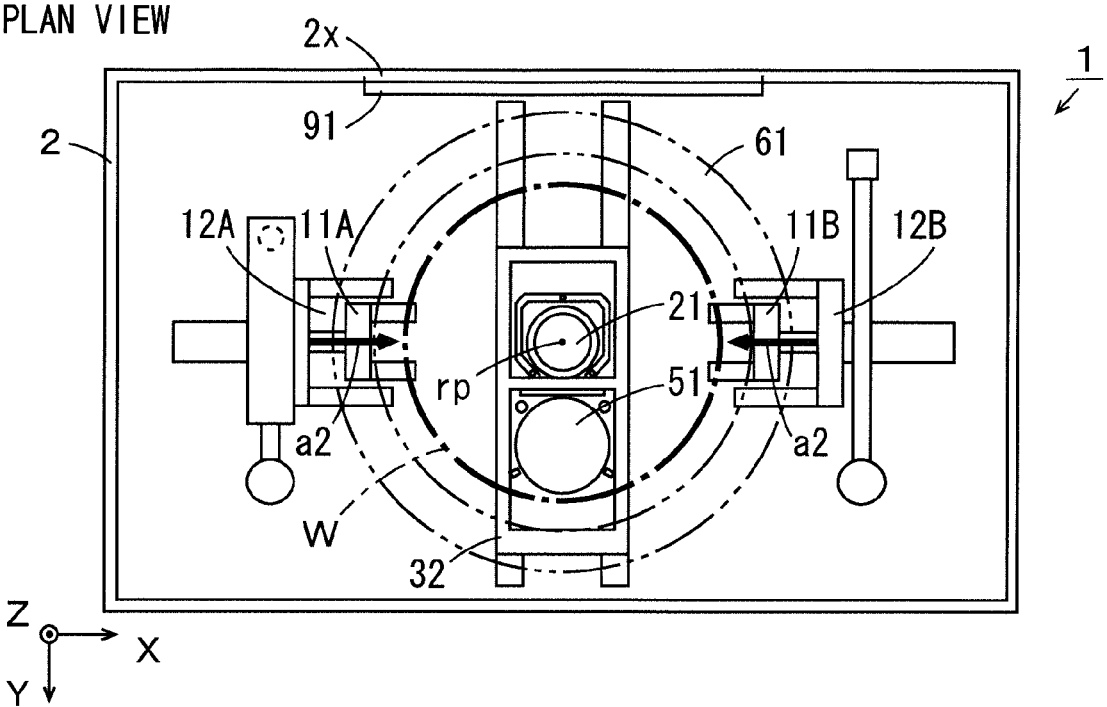
SIDE VIEW TAKEN ALONG LINE A-A
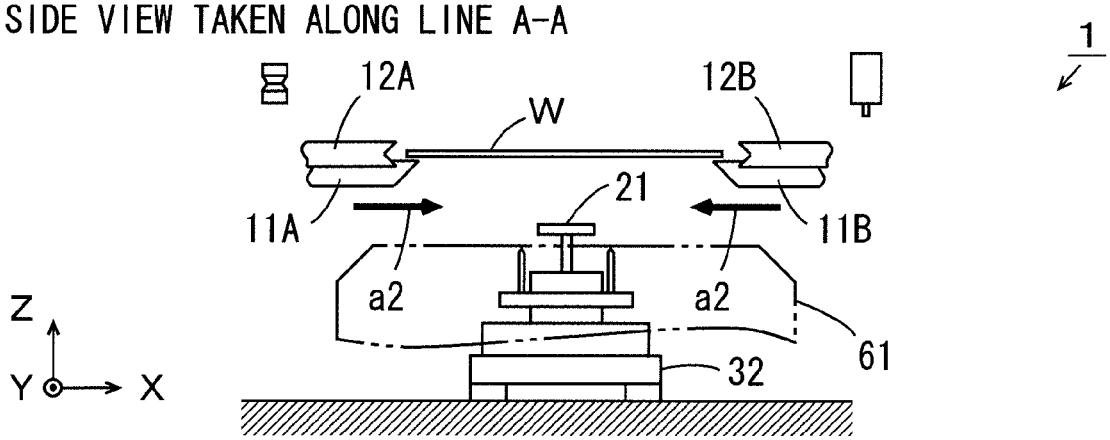
SIDE VIEW TAKEN ALONG LINE B-B
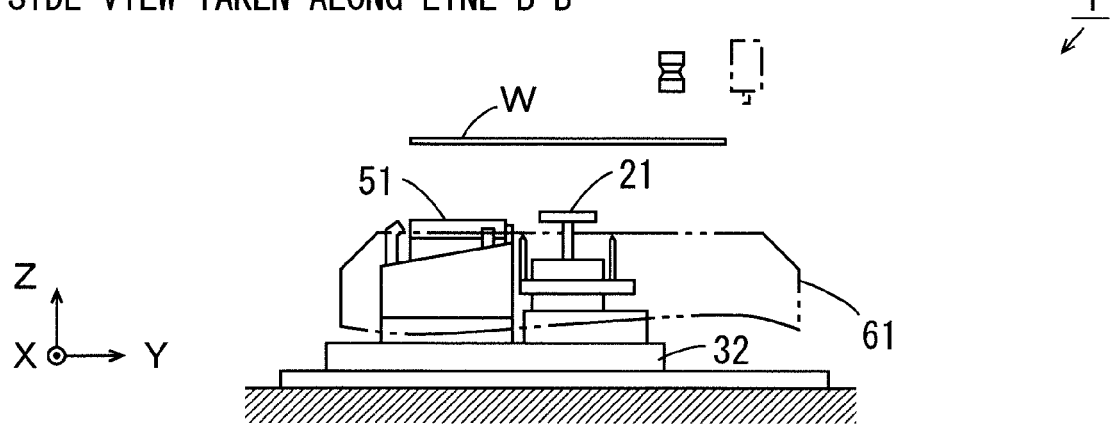

FIG. 6
PLAN VIEW
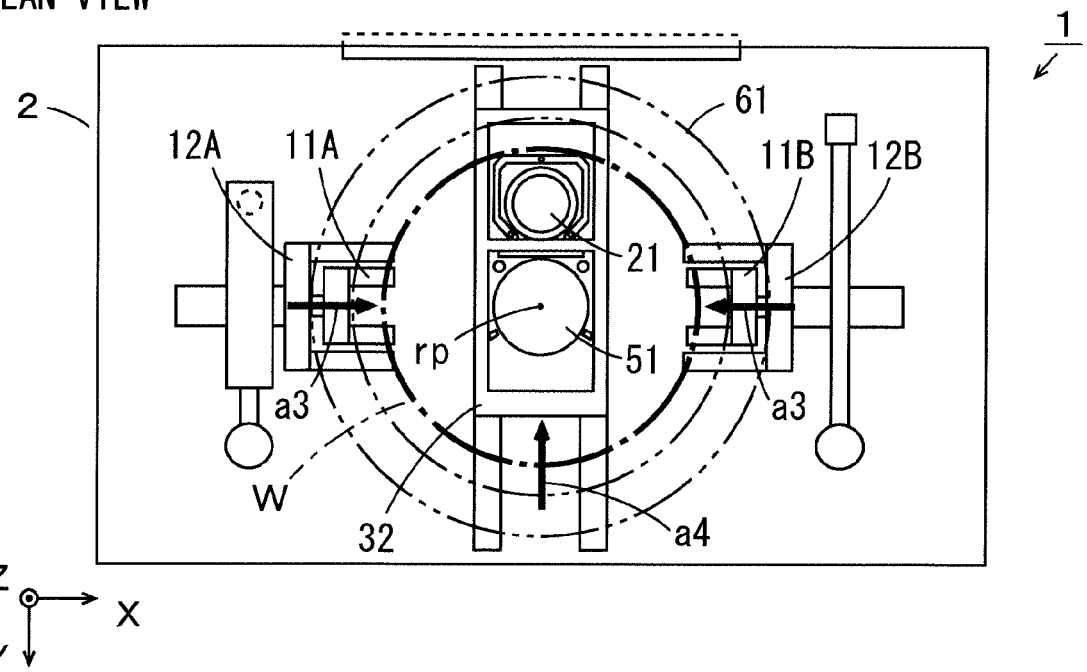
SIDE VIEW TAKEN ALONG LINE A-A
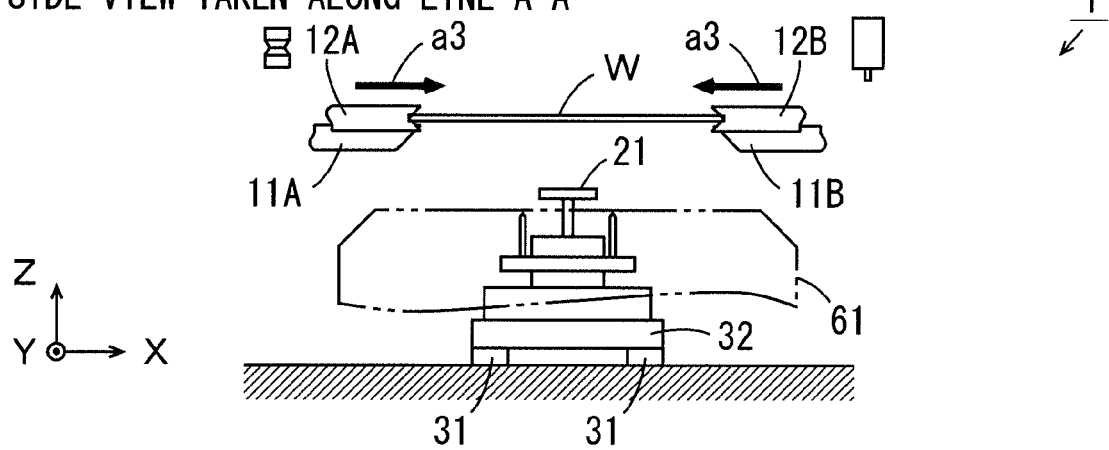
SIDE VIEW TAKEN ALONG LINE B-B
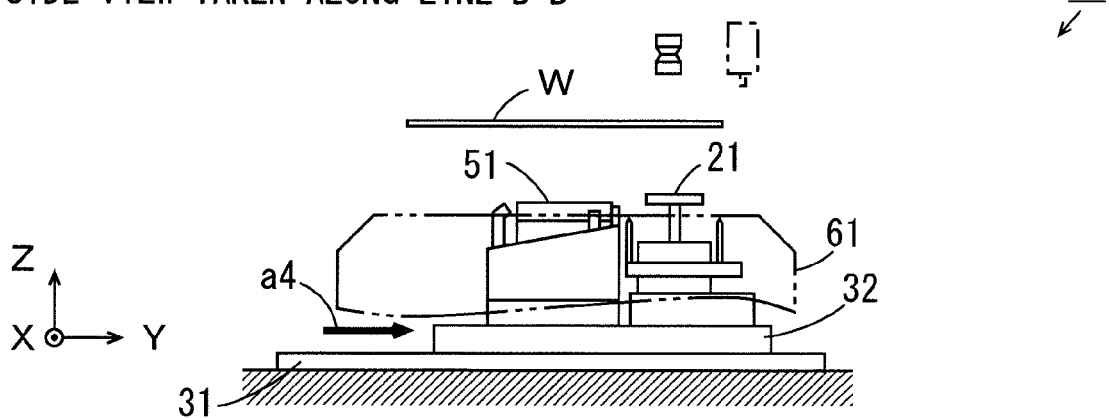

FIG. 7
PLAN VIEW
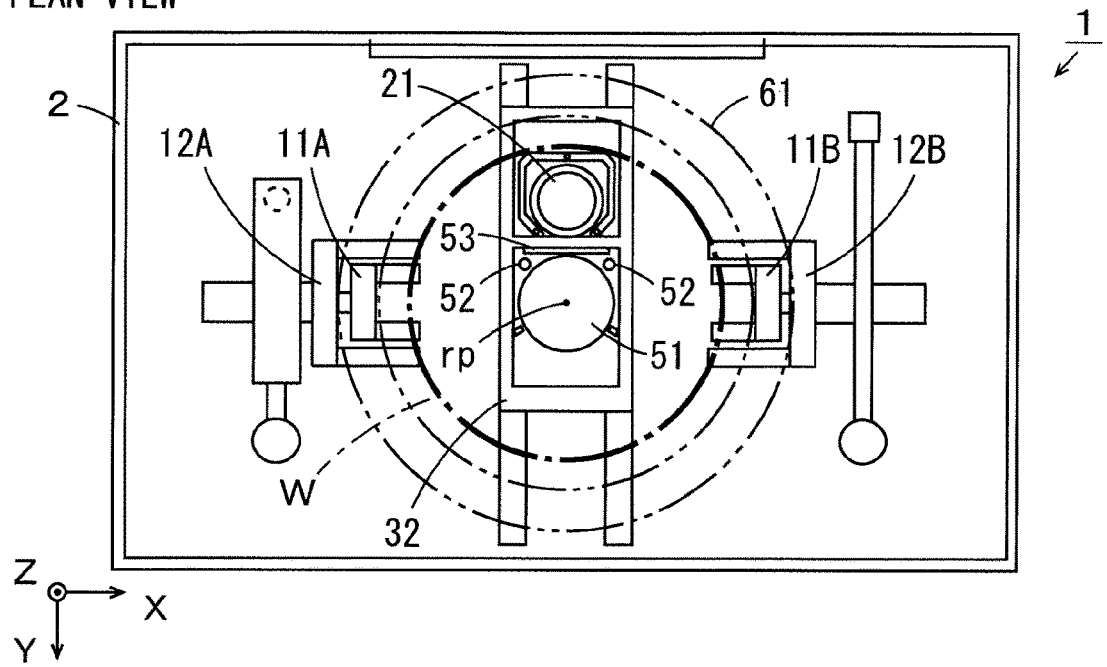
SIDE VIEW TAKEN ALONG LINE A-A
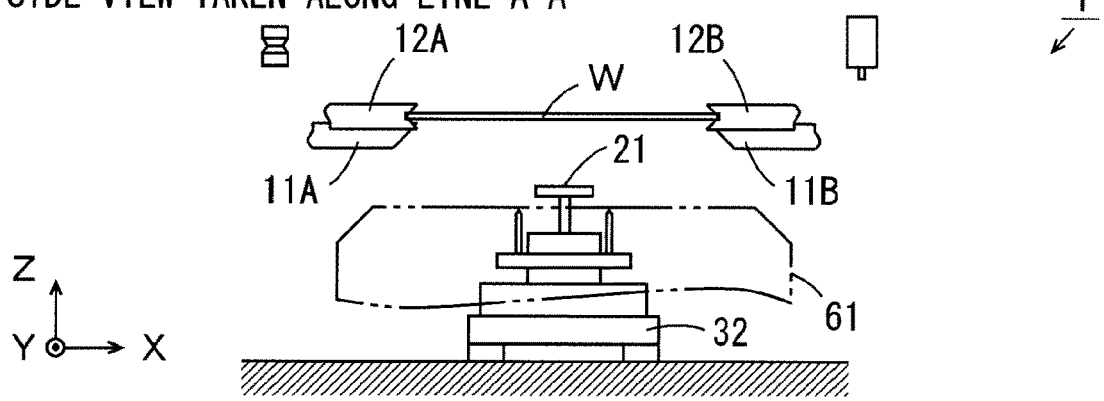
SIDE VIEW TAKEN ALONG LINE B-B
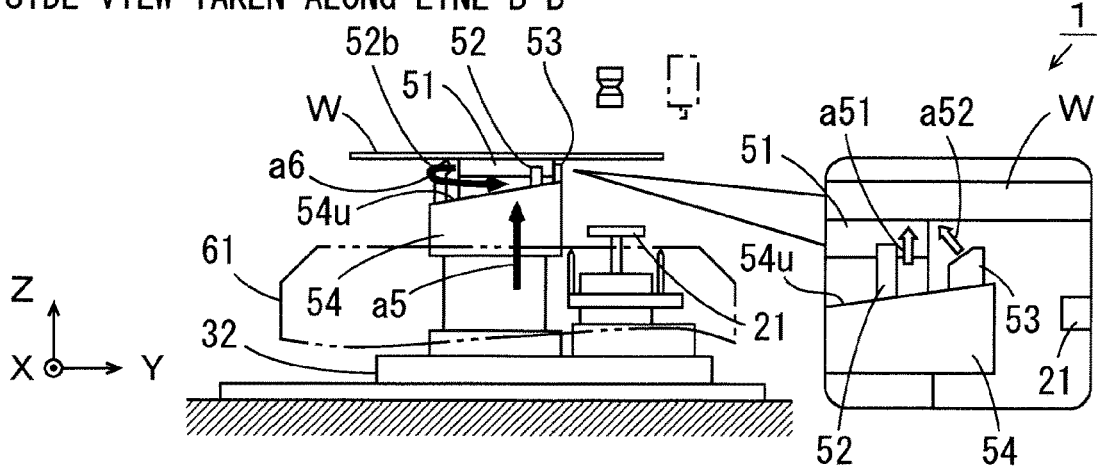

FIG. 8
PLAN VIEW
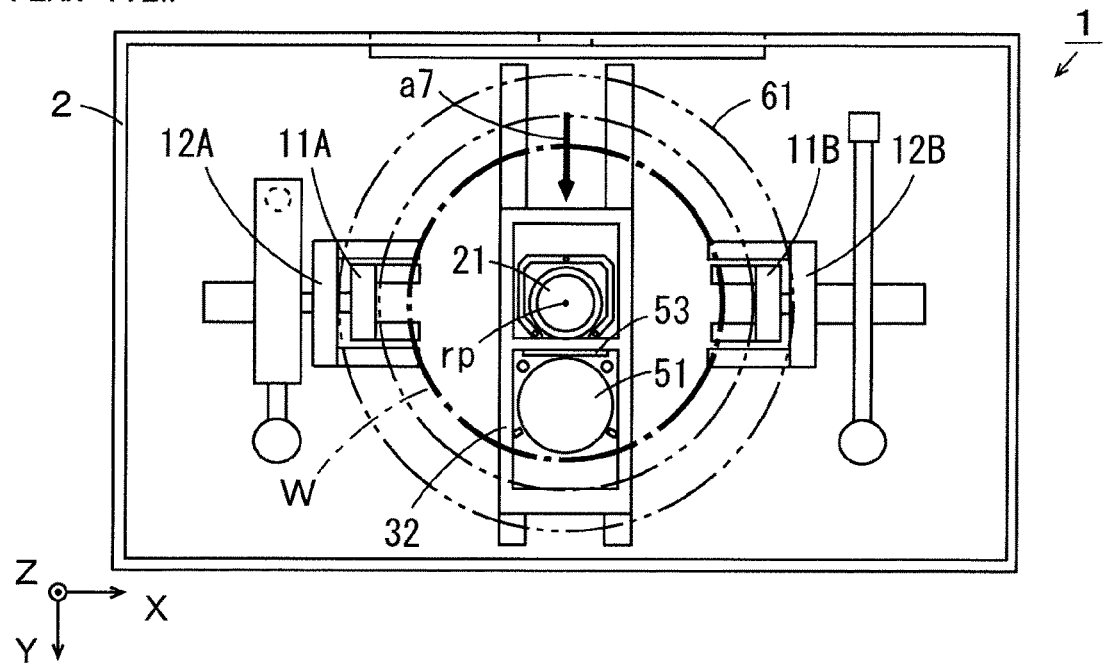
SIDE VIEW TAKEN ALONG LINE A-A
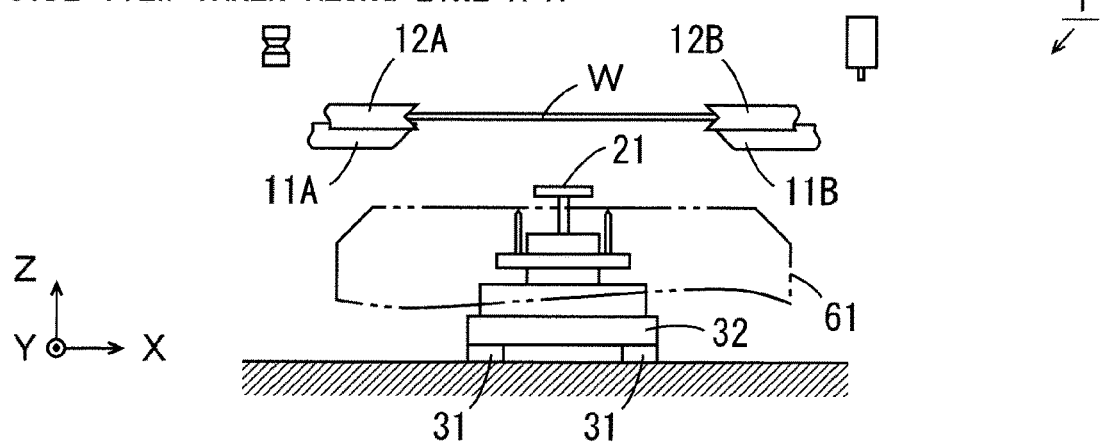
SIDE VIEW TAKEN ALONG LINE B-B
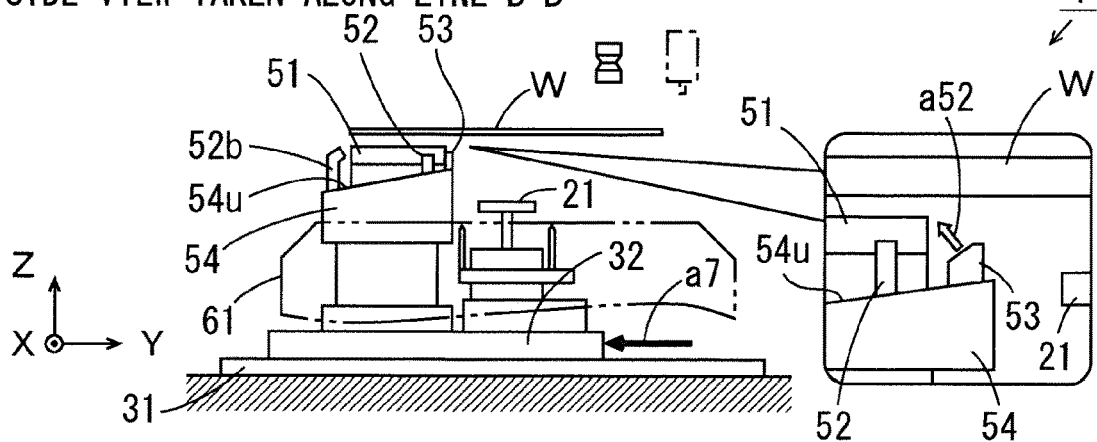

FIG. 9
PLAN VIEW
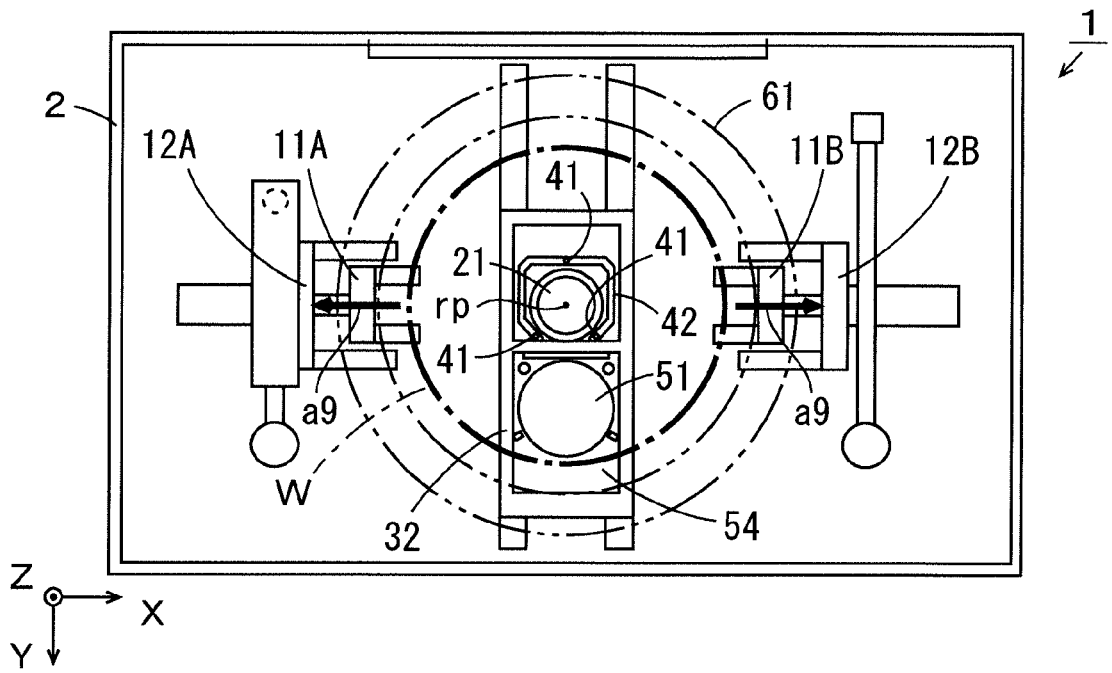
SIDE VIEW TAKEN ALONG LINE A-A
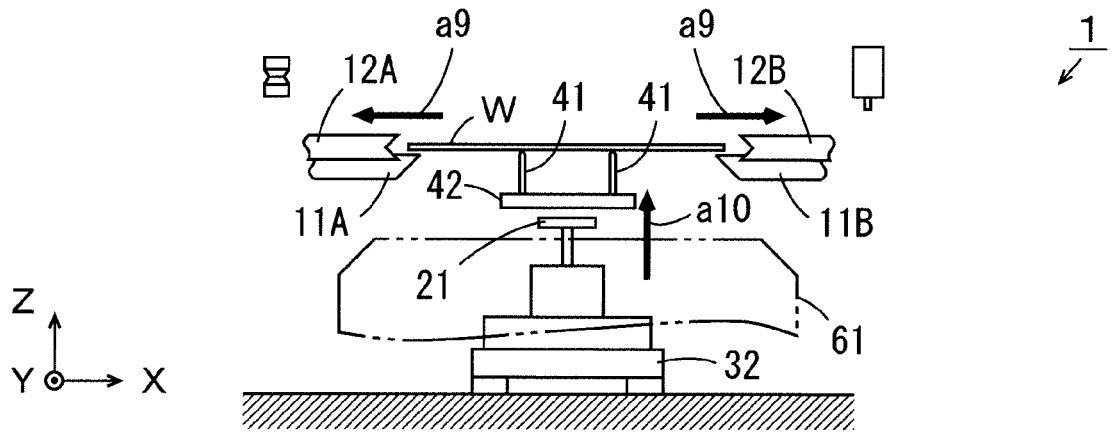
SIDE VIEW TAKEN ALONG LINE B-B
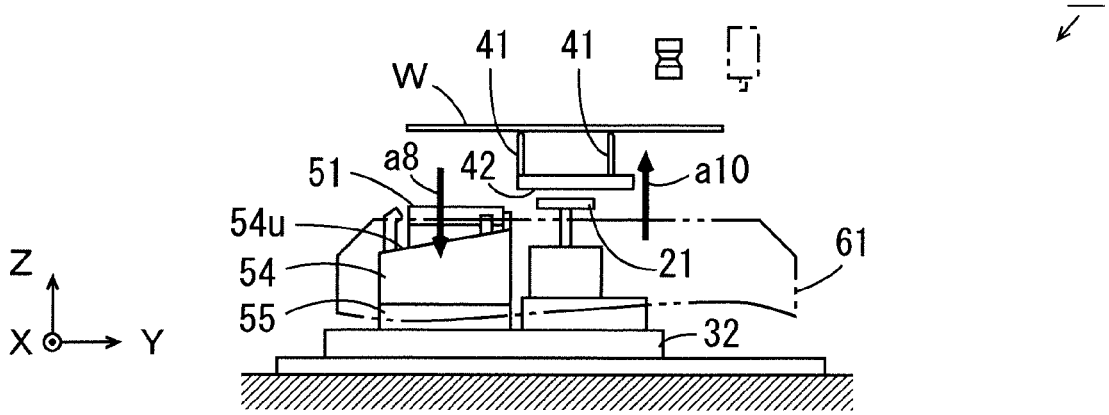

FIG. 10
PLAN VIEW
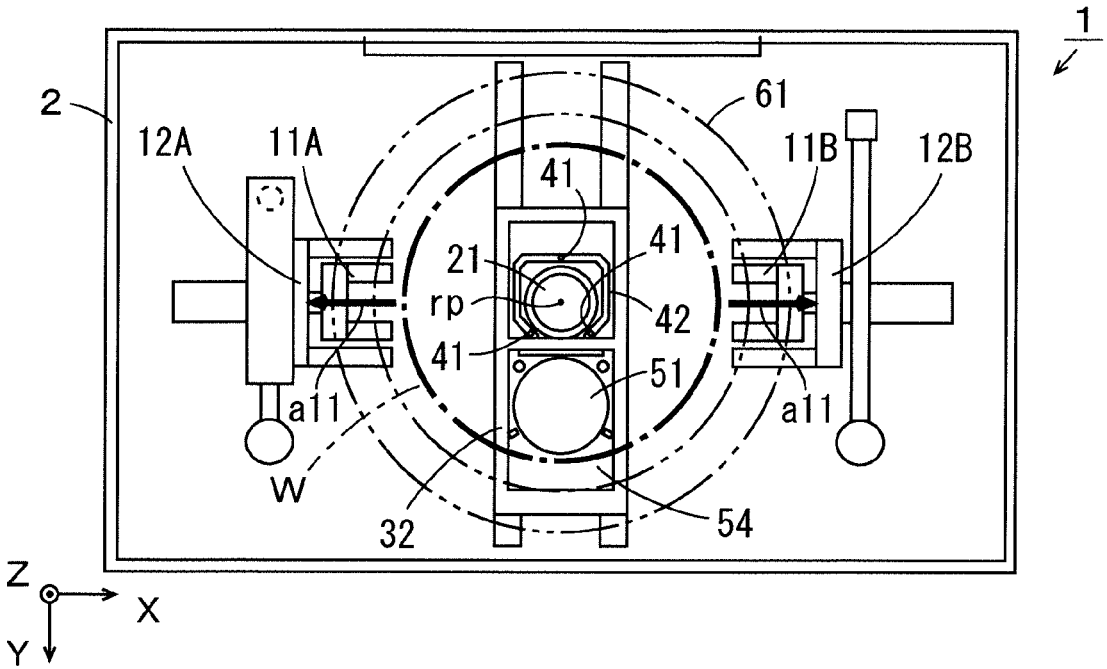
SIDE VIEW TAKEN ALONG LINE A-A
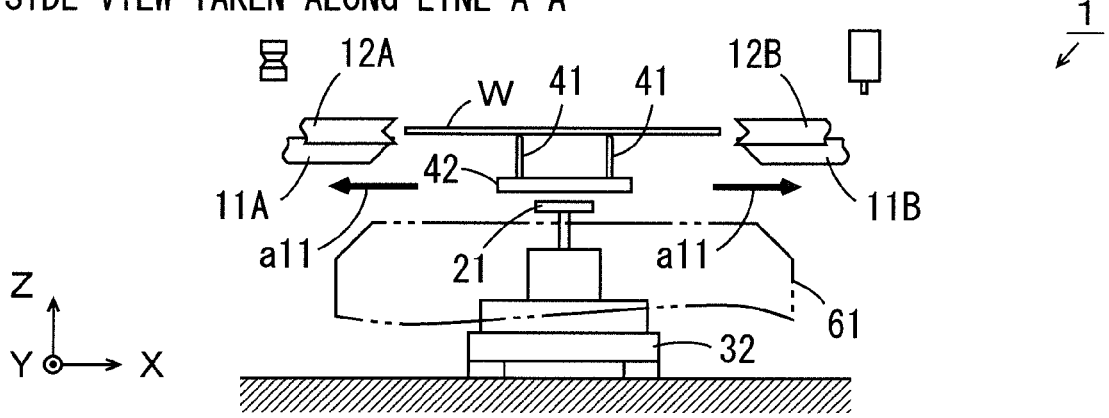
SIDE VIEW TAKEN ALONG LINE B-B
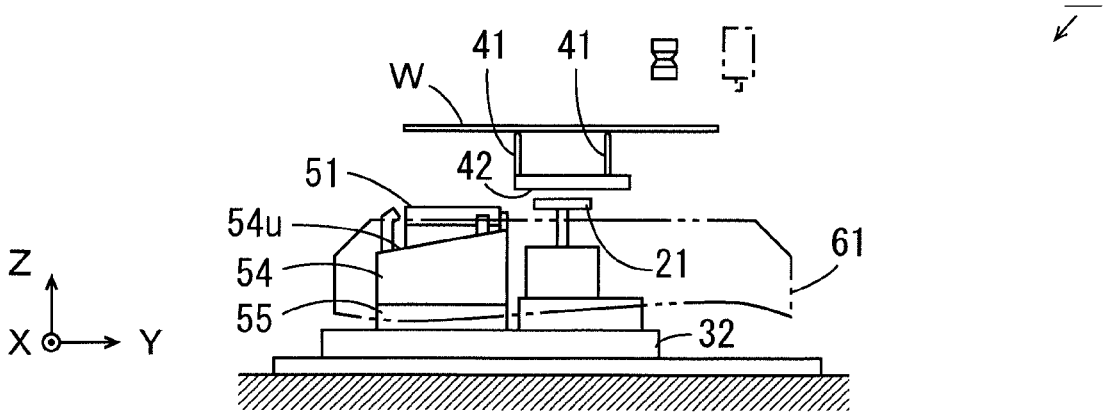

FIG. 11
PLAN VIEW
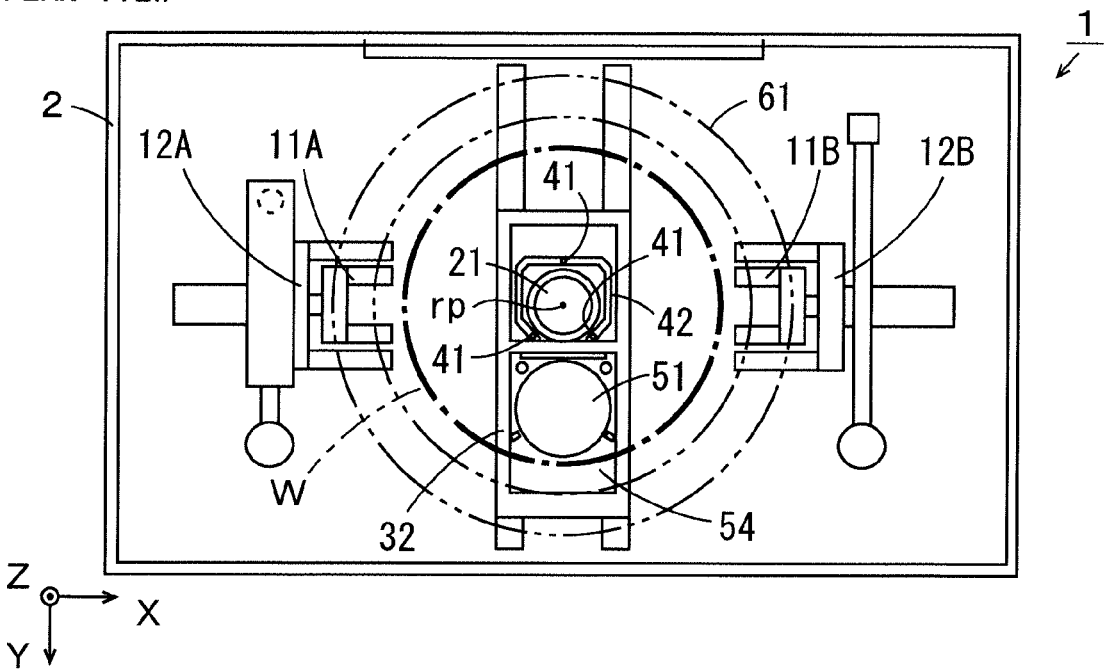
SIDE VIEW TAKEN ALONG LINE A-A
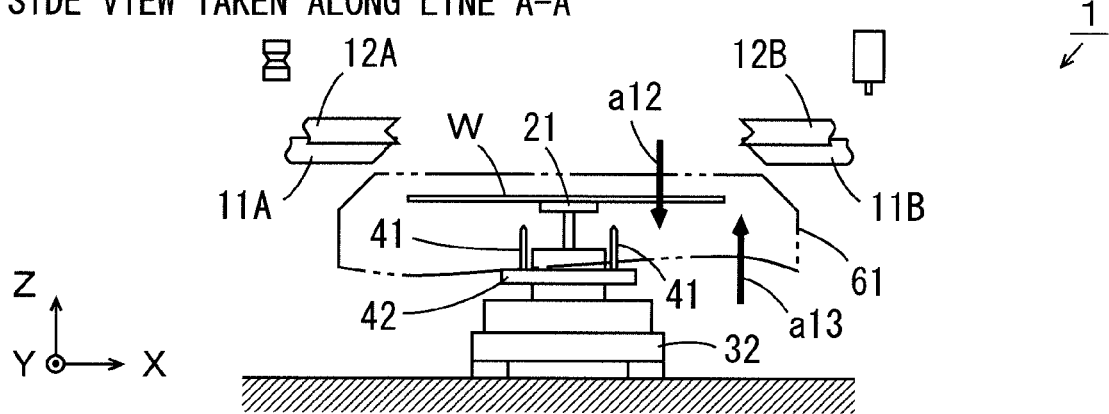
SIDE VIEW TAKEN ALONG LINE B-B
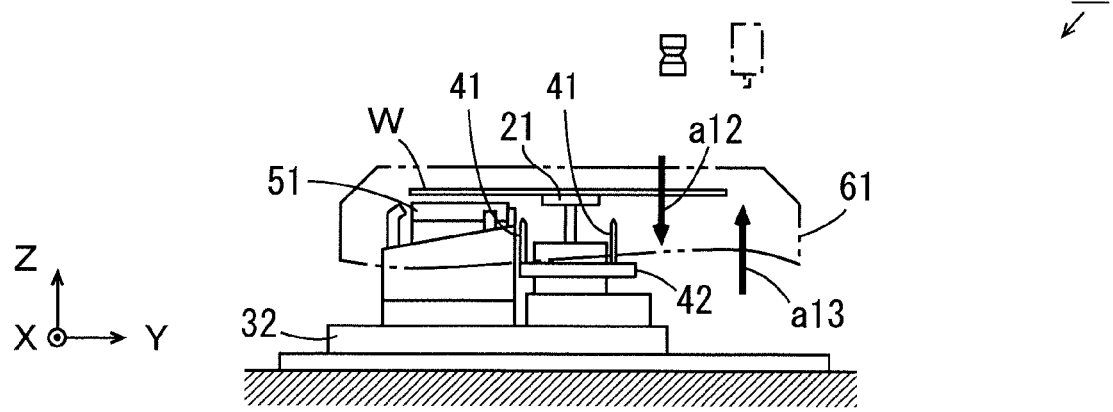

FIG. 12
PLAN VIEW
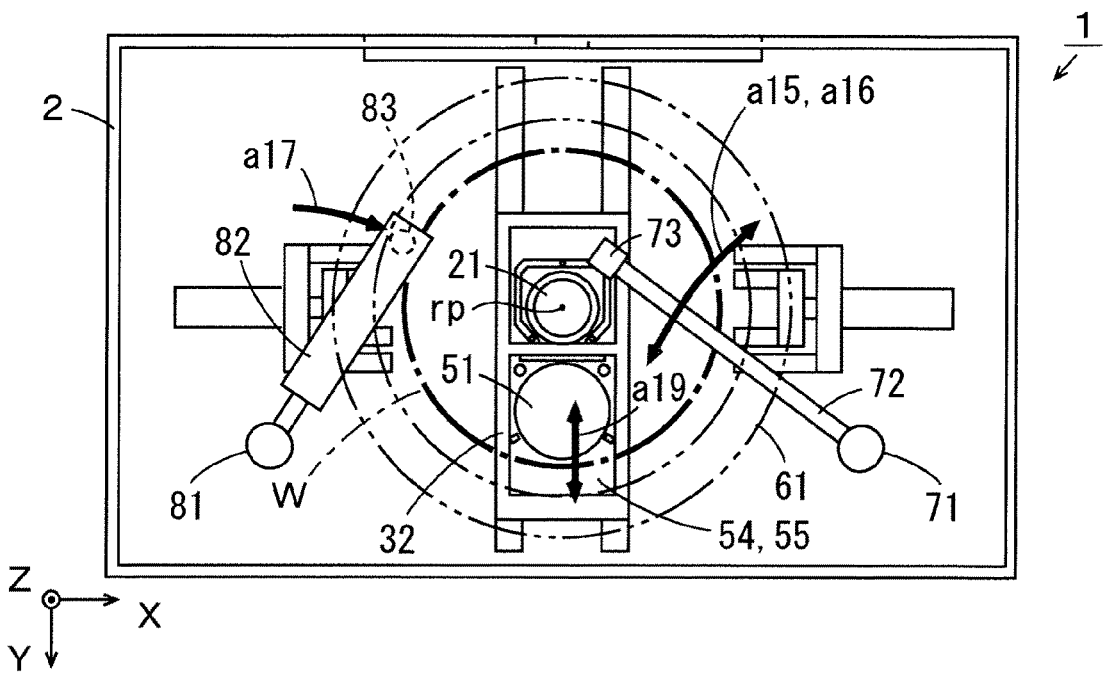
SIDE VIEW TAKEN ALONG LINE A-A
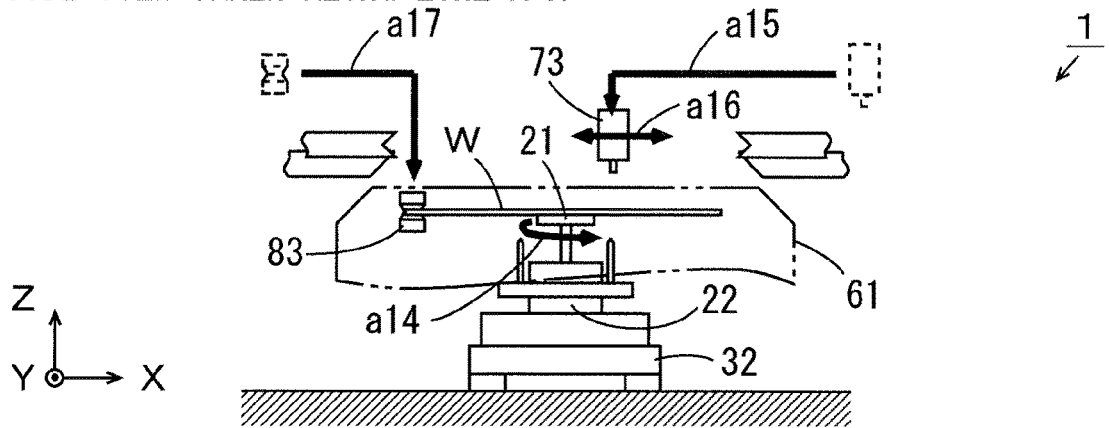
SIDE VIEW TAKEN ALONG LINE B-B
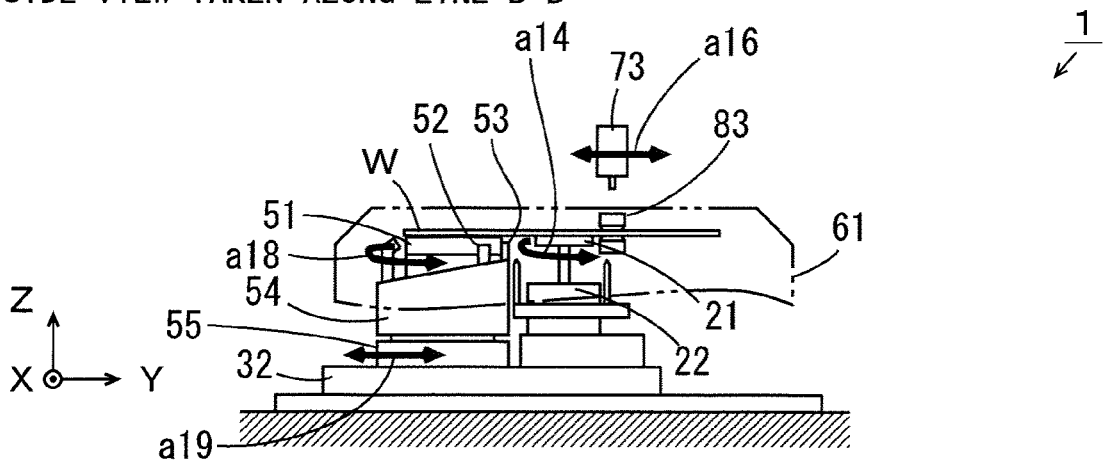

FIG. 13
PLAN VIEW
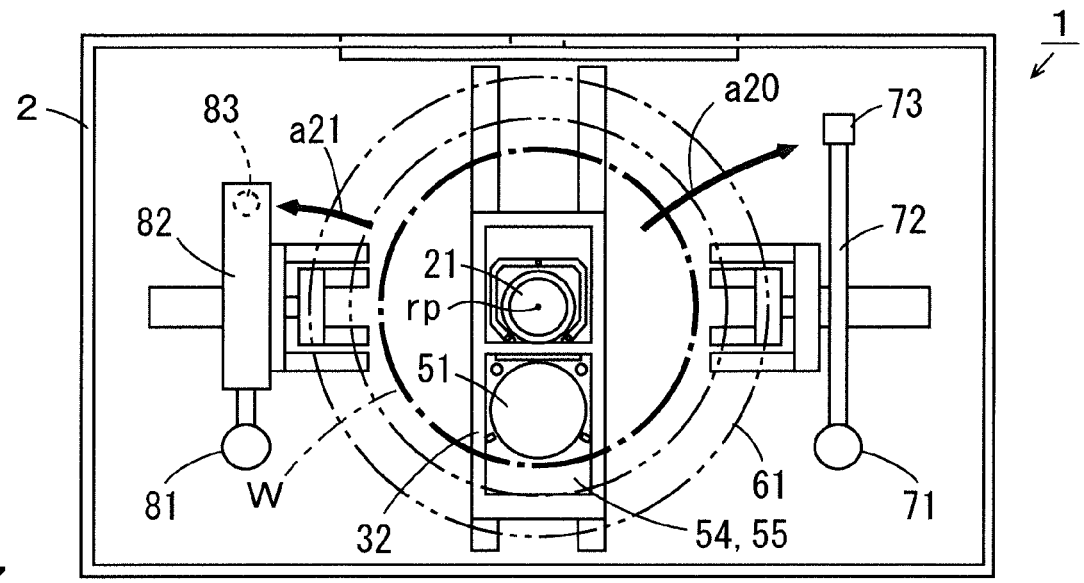
SIDE VIEW TAKEN ALONG LINE A-A
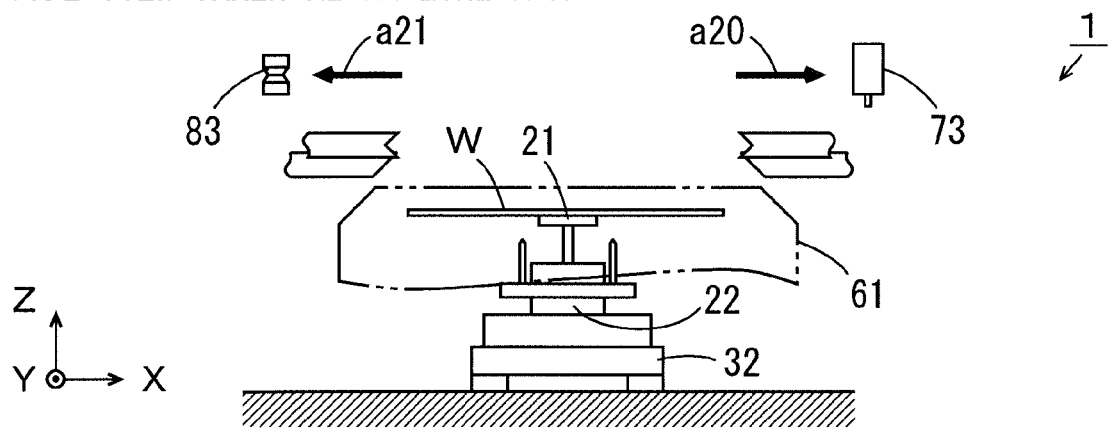
SIDE VIEW TAKEN ALONG LINE B-B
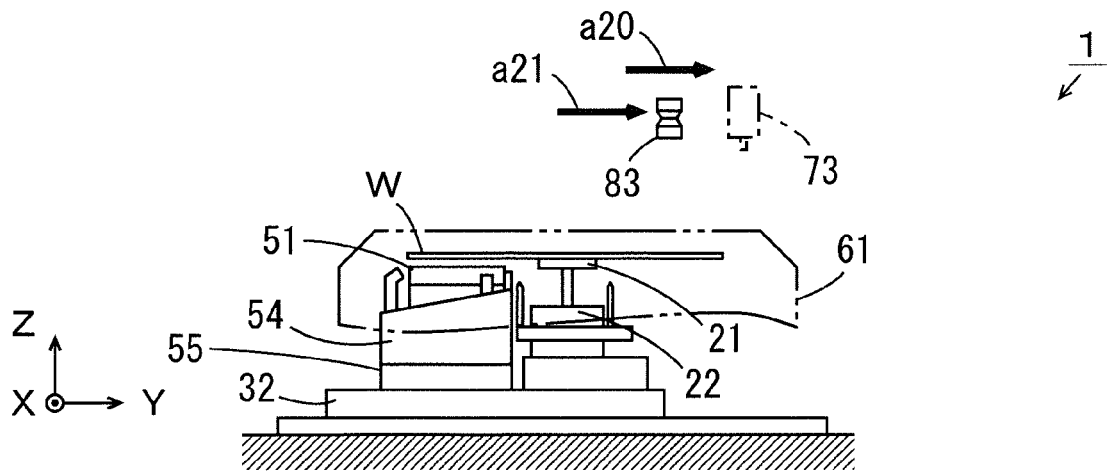

FIG. 14
PLAN VIEW
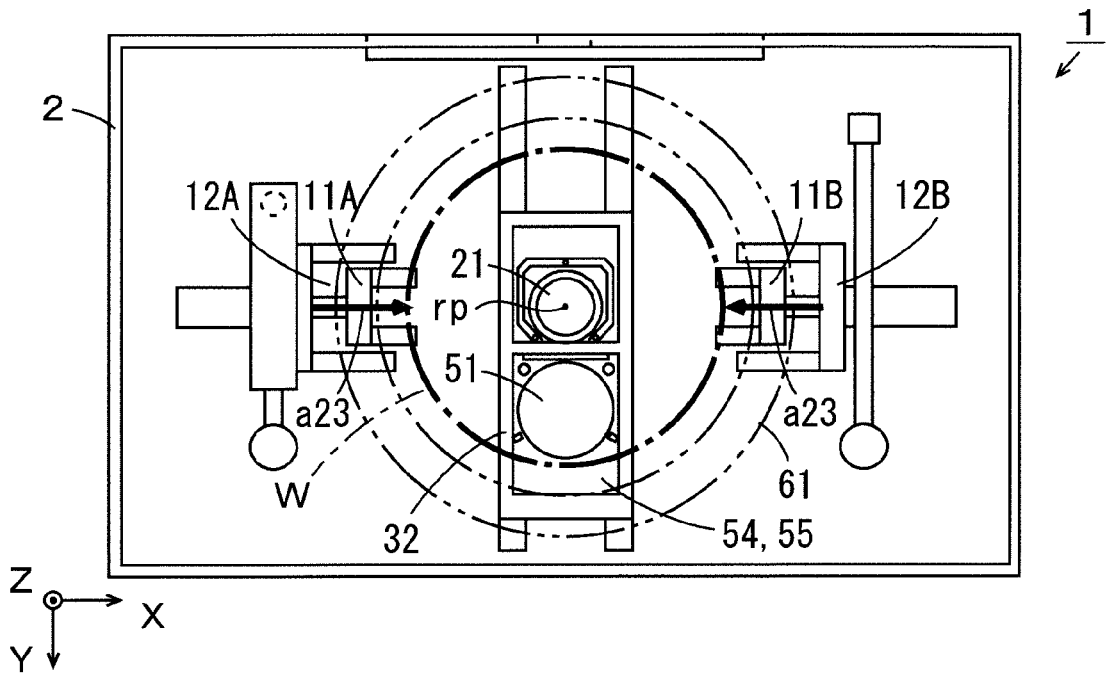
SIDE VIEW TAKEN ALONG LINE A-A
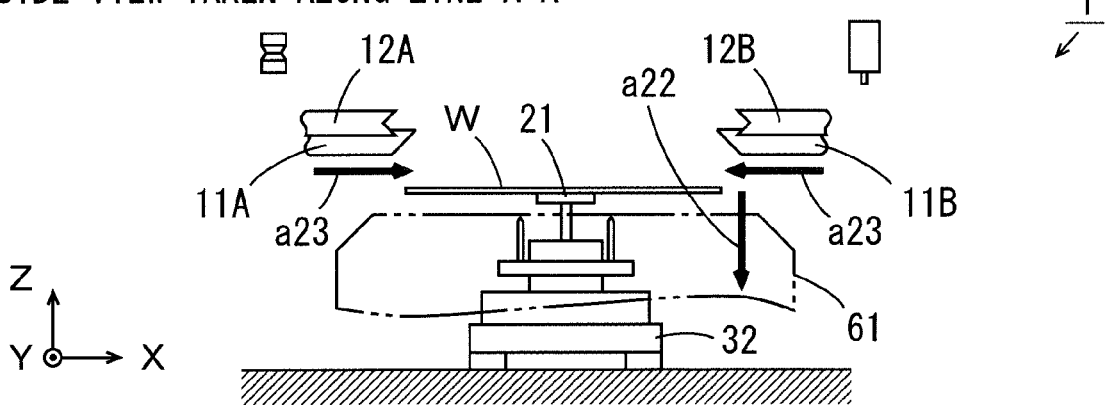
SIDE VIEW TAKEN ALONG LINE B-B
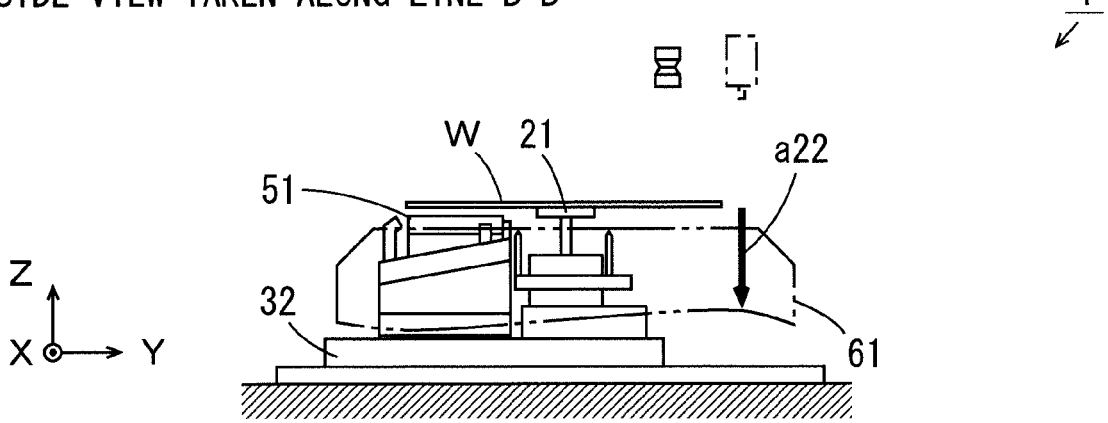

FIG. 15
PLAN VIEW
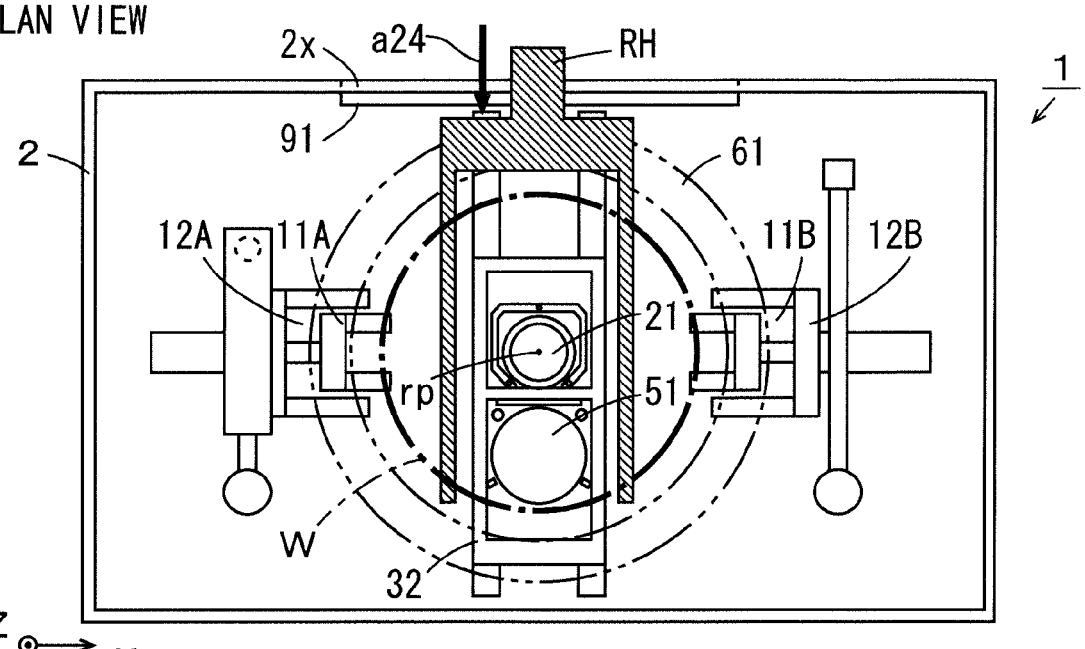
SIDE VIEW TAKEN ALONG LINE A-A
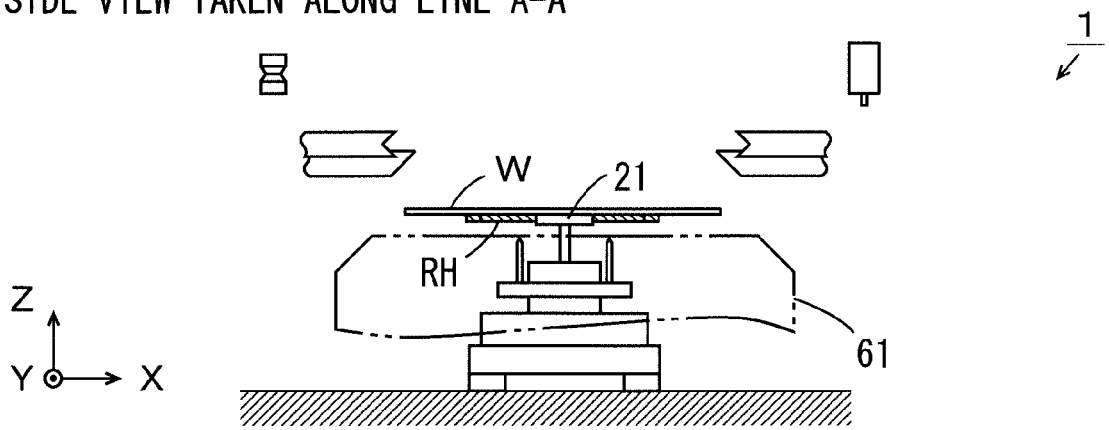
SIDE VIEW TAKEN ALONG LINE B-B
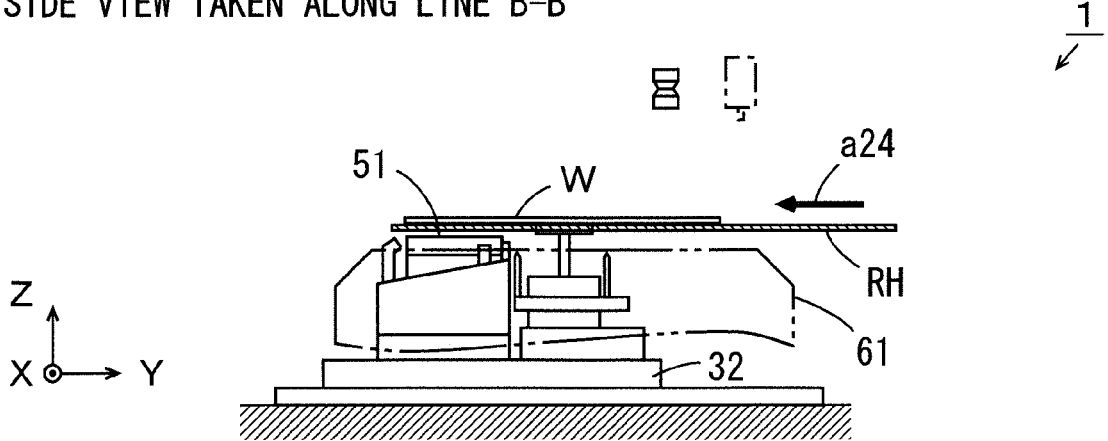

SUBSTRATE CLEANING DEVICE

CROSS-REFERENCE TO RELATED APPLICATIONS

The present application is a 35 U.S.C. §§ 371 national stage application of International Application No. PCT/JP2022/026392, filed Jun. 30, 2022, which claims priority to Japanese Patent Application No. 2021-117423, filed Jul. 15, 2021, the contents of which are incorporated herein by reference.

TECHNICAL FIELD

The present invention relates to a substrate cleaning device that cleans a lower surface of a substrate.

BACKGROUND ART

A substrate processing apparatus is used to perform various processes on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell. A substrate cleaning device is used to clean a substrate.

For example, a substrate cleaning device described in Patent Document 1 includes two suction pads for holding a back-surface peripheral portion of a wafer, a spin chuck for holding a back-surface center portion of the wafer and a brush for cleaning the back surface of the wafer. The two suction pads hold the wafer and move in a transverse direction. In this state, the back-surface center portion of the wafer is cleaned by the brush. Thereafter, the spin chuck receives the wafer from the suction pads. Further, the spin chuck rotates while holding the back-surface center portion of the wafer. In this state, the back-surface peripheral portion of the wafer is cleaned by the brush.

[Patent Document 1] JP 5904169 B2

SUMMARY OF INVENTION

Technical Problem

In the substrate cleaning device, cleanliness of a brush is gradually degraded as a substrate is repeatedly cleaned. When the cleanliness of the brush is degraded, the substrate cannot be efficiently cleaned. Therefore, it is required to maintain the cleanliness of the brush at a certain level or more. However, it is not easy to maintain the cleanliness of the brush without a reduction in throughput.

An object of the present invention is to provide a substrate cleaning device that enables maintenance of cleanliness of a brush without a reduction in throughput.

Solution to Problem (1) A substrate cleaning device according to one aspect of the present invention includes a substrate holder that holds a substrate in a horizontal attitude, a lower-surface brush that is configured to be movable between a processing position for cleaning of the substrate and a waiting position that overlaps with the substrate held by the substrate holder in an up-and-down direction and rotatable about an axis extending in the up-and-down direction, and cleans a lower surface of the substrate by coming into contact with the lower surface of the substrate, a first liquid nozzle that discharges a cleaning liquid to a center portion of the lower-surface brush, at the waiting position, and a second liquid nozzle that discharges a cleaning liquid to an end portion of the lower-surface brush, at the waiting position.

In the substrate cleaning device, the lower-surface brush comes into contact with the lower surface of the substrate while rotating at the processing position, thereby cleaning the lower surface of the substrate. Further, even in a case in which the lower-surface brush is contaminated by cleaning of the lower surface of the substrate, the cleaning liquid is discharged by each of the first liquid nozzle and the second liquid nozzle to each of the center portion and the end portion of the rotating lower-surface brush at the waiting position. With this configuration, it is possible to clean the entire lower-surface brush.

Further, because the waiting position of the lower-surface brush overlaps with the substrate held by the substrate holder in the up-and-down direction, even in a case in which the lower-surface brush is relatively large, the footprint hardly increases. Therefore, it is possible to clean the lower surface of the substrate in a short period of time by using the relatively large lower-surface brush. Therefore, even in a case in which the step of cleaning the lower-surface brush is provided, the throughput hardly changes. Thus, it is possible to maintain the cleanliness of the lower-surface brush without a reduction in throughput.

(2) The substrate cleaning device may further include a supporter that supports the lower-surface brush, wherein each of the first liquid nozzle and the second liquid nozzle may be attached to the supporter such that a discharge port of the cleaning liquid is directed obliquely upwardly. In this case, it is possible to easily clean the lower-surface brush without interfering with cleaning of the lower surface of the substrate by the lower-surface brush.

(3) The first liquid nozzle may discharge the cleaning liquid such that the cleaning liquid is supplied parabolically to the center portion of the lower-surface brush from a position obliquely upward of the lower-surface brush. In this case, it is possible to easily clean the center portion of the lower-surface brush without interfering with cleaning of the lower surface of the substrate by the lower-surface brush.

(4) The lower-surface brush may be formed of a fluorine-based resin. In this case, wettability of the lower-surface brush is relatively low. Thus, the lower-surface brush can be less likely contaminated. Further, because the cleaning liquid is discharged to each of the center portion and the end portion of the lower-surface brush by each of the first liquid nozzle and the second liquid nozzle, the lower-surface brush is uniformly wetted even in a case in which wettability of the lower-surface brush is relatively low. Therefore, the lower-surface brush is prevented from being partially hardened. As a result, the lower surface of the substrate can be uniformly cleaned.

(5) Each of the substrate holder and the lower-surface brush may be circular, and a diameter of the lower-surface brush may be larger than a diameter of the substrate holder. In this case, the lower-surface brush is relatively large. Therefore, the lower surface of the substrate can be efficiently cleaned. Further, because the cleaning liquid is discharged to each of the center portion and the end portion of the lower surface brush by each of the first liquid nozzle and the second liquid nozzle, even when the lower surface brush is relatively large, the lower surface brush is uniformly wetted. Therefore, the lower-surface brush is prevented from being partially hardened. As a result, the lower surface of the substrate can be uniformly cleaned.

(6) Each of the substrate and the lower-surface brush may be circular, and a diameter of the lower-surface brush may be larger than ⅓ of a diameter of the substrate. In this case, the lower-surface brush is relatively large. Therefore, the lower surface of the substrate can be efficiently cleaned. Further, because the cleaning liquid is discharged to each of the center portion and the end portion of the lower surface brush by each of the first liquid nozzle and the second liquid nozzle, even when the lower surface brush is relatively large, the lower surface brush is uniformly wetted. Therefore, the lower-surface brush is prevented from being partially hardened. As a result, the lower surface of the substrate can be uniformly cleaned.

Advantageous Effects of Invention

With the present invention, it is possible to maintain cleanliness of a lower-surface brush without a reduction in throughput.

BRIEF DESCRIPTION OF THE DRAWINGS

FIG. 3 is a block diagram showing the configuration of a control system of the substrate cleaning device.

FIG. 4 is a schematic diagram for explaining the schematic operation of the substrate cleaning device of FIG. 1.

FIG. 5 is a schematic diagram for explaining the schematic operation of the substrate cleaning device of FIG. 1.

FIG. 6 is a schematic diagram for explaining the schematic operation of the substrate cleaning device of FIG. 1.

FIG. 7 is a schematic diagram for explaining the schematic operation of the substrate cleaning device of FIG. 1.

FIG. 8 is a schematic diagram for explaining the schematic operation of the substrate cleaning device of FIG. 1.

FIG. 9 is a schematic diagram for explaining the schematic operation of the substrate cleaning device of FIG. 1.

FIG. 10 is a schematic diagram for explaining the schematic operation of the substrate cleaning device of FIG. 1.

FIG. 11 is a schematic diagram for explaining the schematic operation of the substrate cleaning device of FIG. 1.

FIG. 12 is a schematic diagram for explaining the schematic operation of the substrate cleaning device of FIG. 1.

FIG. 13 is a schematic diagram for explaining the schematic operation of the substrate cleaning device of FIG. 1.

FIG. 14 is a schematic diagram for explaining the schematic operation of the substrate cleaning device of FIG. 1.

FIG. 15 is a schematic diagram for explaining the schematic operation of the substrate cleaning device of FIG. 1.

DESCRIPTION OF EMBODIMENTS

A substrate cleaning device according to embodiments of the present invention will be described below with reference to the drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar cell, or the like. Further, as for a substrate to be used in the present embodiment, at least part of the substrate has a circular outer periphery. For example, the outer periphery except for a notch for positioning is circular.

(1) CONFIGURATION OF SUBSTRATE PROCESSING DEVICE

Figure 1:
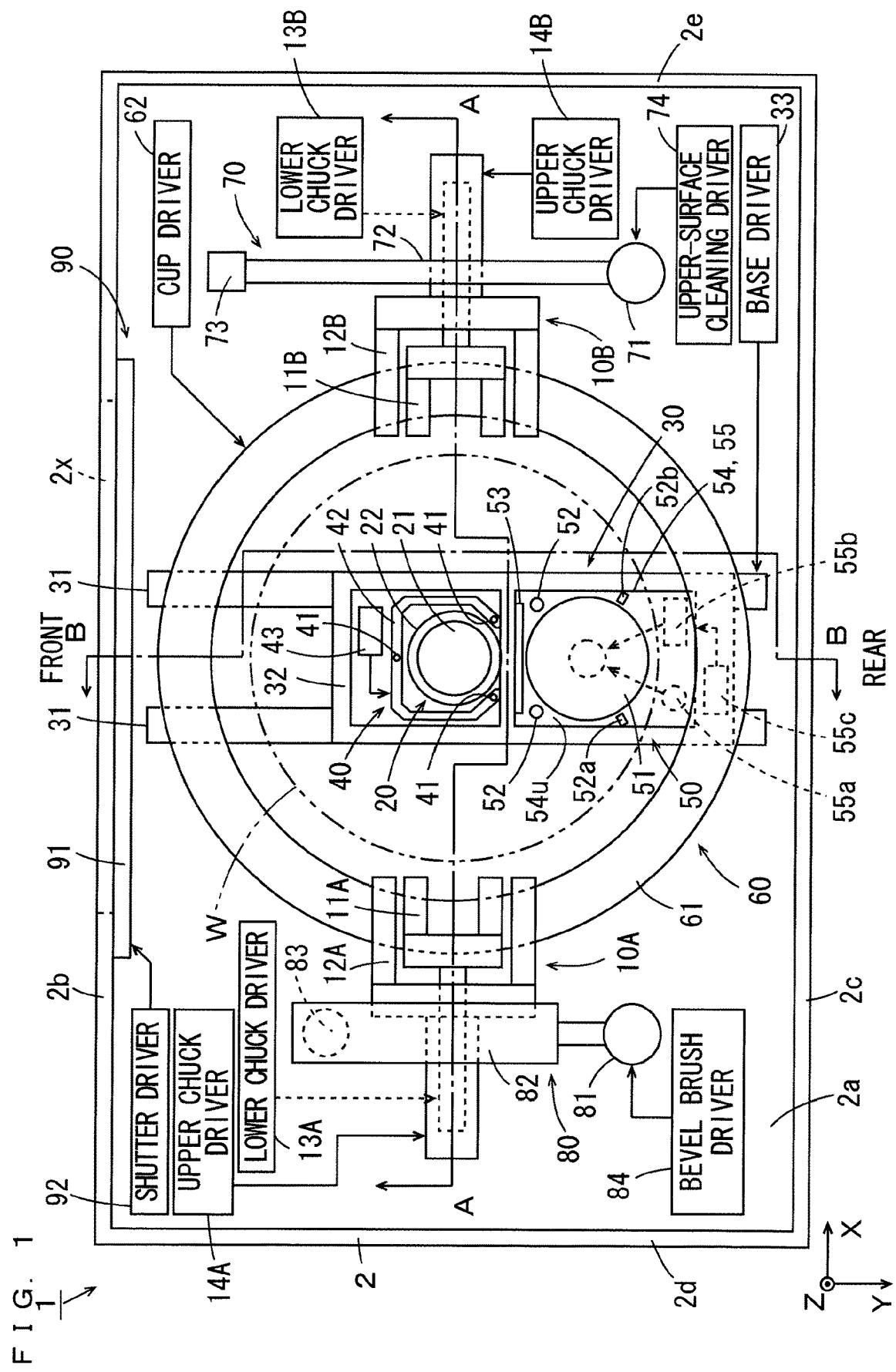
FIG. 1 is a schematic plan view of a substrate cleaning device according to one embodiment of the present invention.
Figure 2:
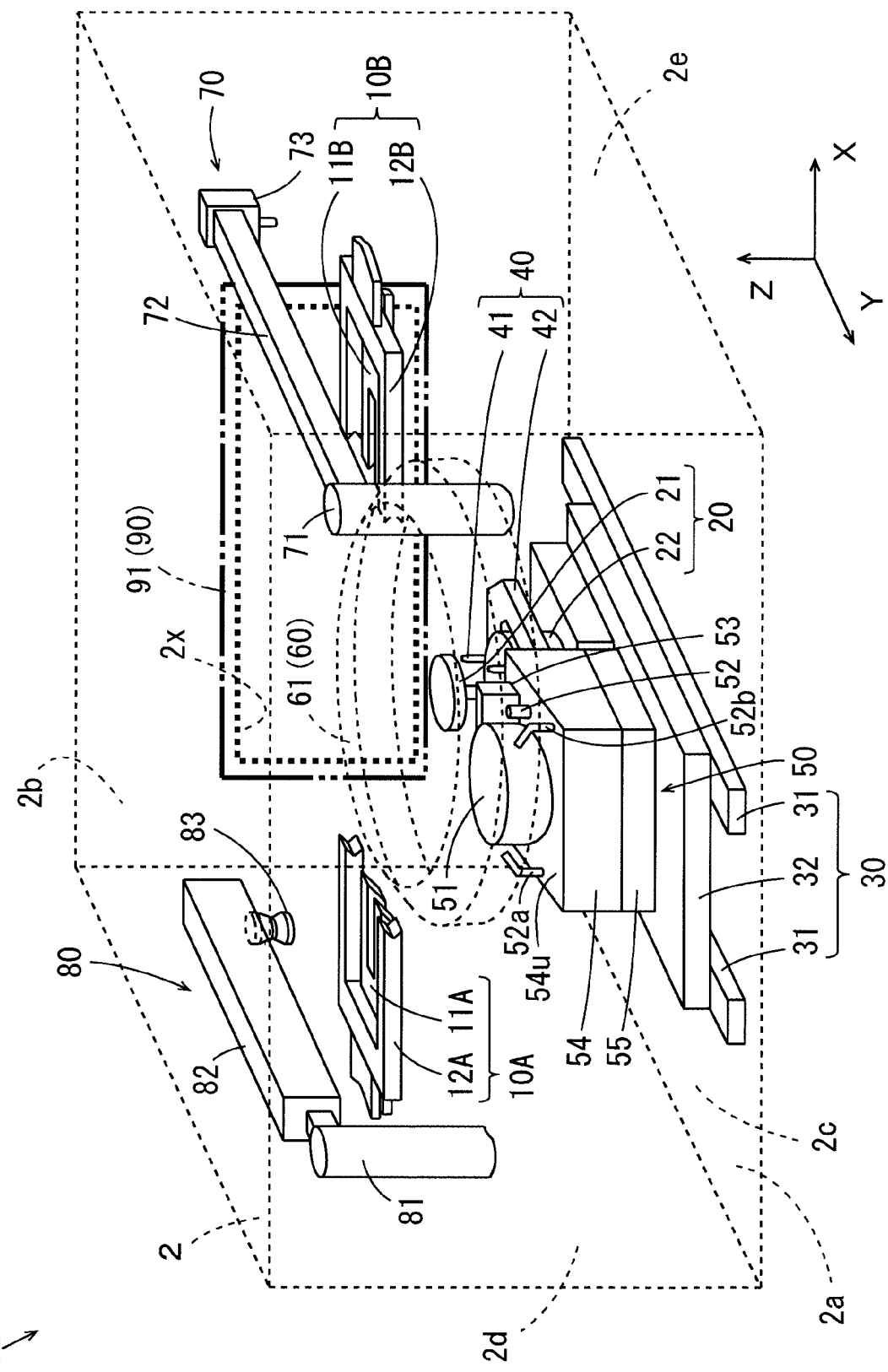
FIG. 2 is an external perspective view showing the inner configuration of the substrate cleaning device of FIG. 1.

FIG. 1 is a schematic plan view of the substrate cleaning device according to one embodiment of the present invention. FIG. 2 is an external perspective view showing the inner configuration of the substrate cleaning device 1 of FIG. 1. In the substrate cleaning device 1 according to the present embodiment, X, Y and Z directions orthogonal to one another are defined for the clarity of a positional relationship. In FIG. 1 and the subsequent drawings, the X, Y and Z directions are suitably indicated by arrows. The X and Y directions are orthogonal to each other within a horizontal plane, and the Z direction corresponds to a vertical direction.

As shown in FIG. 1, the substrate cleaning device 1 includes upper holding devices 10A, 10B, a lower holding device 20, a base device 30, a receiving-transferring device 40, a lower-surface cleaning device 50, a cup device 60, an upper-surface cleaning device 70, an end-portion cleaning device 80 and an opening-closing device 90. These constituent elements are provided in a unit casing 2. In FIG. 2, the unit casing 2 is indicated by the dotted lines.

The unit casing 2 has a rectangular bottom surface portion 2a, and four sidewall portions 2b, 2c, 2d, 2e extending upwardly from the four sides of the bottom surface portion 2a. The sidewall portions 2b, 2c are opposite to each other, and the sidewall portions 2d, 2e are opposite to each other. A rectangular opening is formed in the center portion of the sidewall portion 2b. This opening is an inlet-outlet port 2x for a substrate W and is used when the substrate W is carried into and carried out from the unit casing 2. In FIG. 2, the inlet-outlet port 2x is indicated by the thick dotted lines. In the following description, a direction directed outwardly of the unit casing 2 in the Y direction from the inside of the unit casing 2 through the inlet-outlet port 2x (the direction directed from the sidewall portion 2c toward the sidewall portion 2b) is referred to as forward, and its opposite direction (the direction directed from the sidewall portion 2b toward the sidewall portion 2c) is referred to as rearward.

The opening-closing device 90 is provided in a portion in which the inlet-outlet port 2x is formed and its vicinal region in the sidewall portion 2b. The opening-closing device 90 includes a shutter 91 that is configured to be capable of opening and closing the inlet-outlet port 2x and a shutter driver 92 that drives the shutter 91. In FIG. 2, the shutter 91 is indicated by the thick two-dots and dash lines. The shutter driver 92 drives the shutter 91 to open the inlet-outlet port 2x when the substrate W is carried into and carried out from the substrate cleaning device 1. Further, the shutter driver 92 drives the shutter 91 to close the inlet-outlet port 2x when the substrate W is cleaned in the substrate cleaning device 1.

The base device 30 is provided in the center portion of the bottom surface portion 2a. The base device 30 includes linear guides 31, a mobile base 32 and a base driver 33. The linear guides 31 include two rails and are provided to extend in the Y direction from positions in the vicinity of the sidewall portion 2b to positions in the vicinity of the sidewall portion 2c in plan view. The mobile base 32 is provided to be movable in the Y direction on the two rails of the linear guides 31. The base driver 33 includes a pulse motor, for example, and moves the mobile base 32 in the Y direction on the linear guides 31.

The lower holding device 20 and the lower-surface cleaning device 50 are provided on the mobile base 32 to be arranged in the Y direction. The lower holding device 20 includes a suction holder 21 and a suction holding driver 22. The suction holder 21 is a so-called spin chuck, has a circular suction surface that can hold a lower surface of the substrate W by suction and is configured to be rotatable about an axis extending in the up-and-down direction (the axis extending in the Z direction). In the following description, a region that is to be sucked by the suction surface of the suction holder 21 in the lower surface of the substrate W when the substrate W is held by suction by the suction holder 21 is referred to as a lower-surface center region. On the other hand, a region, surrounding the lower-surface center region, in the lower surface of the substrate W is referred to as a lower-surface outer region.

The suction holding driver 22 includes a motor. The motor of the suction holding driver 22 is provided on the mobile base 32 such that its rotation shaft projects upwardly. The suction holder 21 is provided at the upper end portion of the rotation shaft of the suction holding driver 22. Further, in the rotation shaft of the suction holding driver 22, a suction path for holding the substrate W by suction in the suction holder 21 is formed. The suction path is connected to a suction device (not shown). The suction holding driver 22 rotates the suction holder 21 about the above-mentioned rotation shaft.

On the mobile base 32, the receiving-transferring device 40 is further provided in the vicinity of the lower holding device 20. The receiving-transferring device 40 includes a plurality (three in the present example) of support pins 41, a pin coupling member 42 and a pin lifting-lowering driver 43. The pin coupling member 42 is formed to surround the suction holder 21 in plan view and couples the plurality of support pins 41 to one another. The plurality of support pins 41 extend upwardly by a certain length from the pin coupling member 42 while being coupled to one another by the pin coupling member 42. The pin lifting-lowering driver 43 lifts and lowers the pin coupling member 42 on the mobile base 32. Thus, the plurality of support pins 41 are lifted and lowered relative to the suction holder 21.

The lower-surface cleaning device 50 includes a lower-surface brush 51, two liquid nozzles 52, liquid nozzles 52a, 52b, a gas injector 53, a lifting-lowering supporter 54, a movement supporter 55, a lower-surface brush rotation driver 55a, a lower-surface brush lifting-lowering driver 55b and a lower-surface brush movement driver 55c. The movement supporter 55 is provided to be movable in the Y direction with respect to the lower holding device 20 in a certain region on the mobile base 32. As shown in FIG. 2, the lifting-lowering supporter 54 is provided on the movement supporter 55 to be liftable and lowerable. The lifting-lowering supporter 54 has an upper surface 54u that is inclined downwardly in a direction away from the suction holder 21 (rearwardly in the present example).

As shown in FIG. 1, the lower-surface brush 51 has a circular outer shape in plan view and is formed to be relatively large in the present embodiment. Specifically, the diameter of the lower-surface brush 51 is larger than the diameter of the suction surface of the suction holder 21 and is 1.3 times of the diameter of the suction surface of the suction holder 21, for example. Further, the diameter of the lower-surface brush 51 is larger than ⅓ of the diameter of the substrate W and smaller than ½ of the diameter of the substrate W. The diameter of the substrate W is 300 mm, for example.

The lower-surface brush 51 is preferably formed of a material having relatively low wettability such as a fluorine-based resin. In this case, adhesion of contaminants to the lower-surface brush 51 is reduced. Thus, the lower-surface brush 51 is less likely to be contaminated. While the lower-surface brush 51 is formed of PTFE (Polytetrafluoroethylene) in the present example, the embodiment is not limited to this. The lower-surface brush 51 may be formed of a relatively soft resin material such as PVA (polyvinyl alcohol).

The lower-surface brush 51 has a cleaning surface that can come into contact with the lower surface of the substrate W. Further, the lower-surface brush 51 is attached to the upper surface 54u of the lifting-lowering supporter 54 such that the cleaning surface is directed upwardly and the cleaning surface is rotatable about an axis extending in the up-and-down direction through the center of the cleaning surface.

Each of the two liquid nozzles 52 is attached to the upper surface 54u of the lifting-lowering supporter 54 to be located in the vicinity of the lower-surface brush 51. Further, each of the two liquid nozzles 52 is attached to the upper surface 54u such that a liquid discharge port is directed upwardly. A lower-surface cleaning liquid supplier 56 (FIG. 3) is connected to the liquid nozzles 52. The lower-surface cleaning liquid supplier 56 supplies a cleaning liquid to the liquid nozzles 52. When the substrate W is cleaned by the lower-surface brush 51, the liquid nozzles 52 discharge the cleaning liquid supplied from the lower-surface cleaning liquid supplier 56 to the lower surface of the substrate W. In the present embodiment, pure water is used as the cleaning liquid to be supplied to the liquid nozzles 52.

Each of the two liquid nozzles 52a, 52b is attached to the upper surface 54u of the lifting-lowering supporter 54 to be located in the vicinity of the lower-surface brush 51. Further, each of the two liquid nozzles 52a, 52b is attached to the upper surface 54u such that a liquid discharge port is directed upwardly. A brush cleaning liquid supplier 57 (FIG. 3) is connected to the liquid nozzles 52a, 52b. The brush cleaning liquid supplier 57 supplies a cleaning liquid to the liquid nozzles 52a, 52b. When the lower-surface brush 51 is cleaned, the liquid nozzles 52a, 52b respectively discharge the cleaning liquid supplied from the brush cleaning liquid supplier 57 to the center portion and the end portion of the cleaning surface of the lower-surface brush 51. In the present embodiment, pure water is used as the cleaning liquid to be supplied to the liquid nozzles 52a, 52b.

In this manner, the cleaning liquid is discharged to each of the center portion and the end portion of the cleaning surface of the lower-surface brush 51 by each of the liquid nozzles 52a, 52b. Therefore, even in a case in which the lower-surface brush 51 is relatively large or a case in which the lower-surface brush 51 is formed of a material having relatively low wettability (PTFE in the present example), the cleaning surface of the lower-surface brush 51 is uniformly wetted. Thus, the lower-surface brush 51 is prevented from being partially hardened. As a result, the lower surface of the substrate W can be uniformly cleaned by the lower-surface brush 51.

The gas injector 53 is a slit-like gas injection nozzle having a gas injection port extending in one direction. The gas injector 53 is attached to the upper surface 54*u* of the lifting-lowering supporter 54 to be located between the lower-surface brush 51 and the suction holder 21 in plan view. Further, the gas injector 53 is attached to the upper surface 54*u* of the lifting-lowering supporter 54 such that a gas injection port is directed upwardly. An injection gas supplier 58 (FIG. 3) is connected to the gas injector 53. The injection gas supplier 58 supplies gas to the gas injector 53. In the present embodiment, an inert gas such as a nitrogen gas is used as the gas to be supplied to the gas injector 53. The gas injector 53 injects the gas supplied from the injection gas supplier 58 to the lower surface of the substrate W during cleaning of the substrate W by the lower-surface brush 51 and during drying of the lower surface of the substrate W, as described below. In this case, a strip-shaped gas curtain extending in the X direction is formed between the lower-surface brush 51 and the suction holder 21.

The lower-surface brush rotation driver 55*a* includes a motor, and rotates the lower-surface brush 51 during cleaning of the substrate W by the lower-surface brush 51. The lower-surface brush lifting-lowering driver 55*b* includes a stepping motor or an air cylinder, and lifts and lowers the lifting-lowering supporter 54 with respect to the movement supporter 55. The lower-surface brush movement driver 55*c* includes a motor, and moves the movement supporter 55 in the Y direction on the mobile base 32. Here, the position of the lower holding device 20 in the mobile base 32 is fixed. Therefore, when being moved by the lower-surface brush movement driver 55*c* in the Y direction, the movement supporter 55 is moved relative to the lower holding device 20. In the following description, the position of the lower-surface cleaning device 50 being located closest to the lower holding device 20 on the mobile base 32 is referred to as a proximal position, and the position of the lower-surface cleaning device 50 being located farthest from the lower holding device 20 on the mobile base 32 is referred to as a distal position.

The cup device 60 is further provided in the center portion of the bottom surface portion 2*a*. The cup device 60 includes a cup 61 and a cup driver 62. The cup 61 is provided to surround the lower holding device 20 and the base device 30 in plan view, and be liftable and lowerable. In FIG. 2, the cup 61 is indicated by the dotted lines. The cup driver 62 moves the cup 61 between a lower cup position and an upper cup position in accordance with which portion of the lower surface of the substrate W is to be cleaned by the lower-surface brush 51. The lower cup position is a height position at which the upper end portion of the cup 61 is located farther downwardly than the substrate W held by suction by the suction holder 21. Further, the upper cup position is a height position at which the upper end portion of the cup 61 is located farther upwardly than the suction holder 21.

At height positions farther upward than the cup 61, the pair of upper holding devices 10A, 10B is provided to be opposite to each other with the base device 30 held therebetween in plan view. The upper holding device 10A includes a lower chuck 11A, an upper chuck 12A, a lower chuck driver 13A and an upper chuck driver 14A. The upper holding device 10B includes a lower chuck 11B, an upper chuck 12B, a lower chuck driver 13B and an upper chuck driver 14B.

The lower chucks 11A, 11B are arranged symmetrically with respect to a vertical plane extending in the Y direction (the front-and-rear direction) through the center of the suction holder 21 in plan view, and are provided to be movable in the X direction in a common horizontal plane. Each of the lower chucks 11A, 11B has two support pieces that can support the lower-surface peripheral portion of the substrate W from below the substrate W. The lower chuck drivers 13A, 13B move the lower chucks 11A, 11B such that the lower chucks 11A, 11B are closer to each other or are farther away from each other.

Similarly to the lower chucks 11A, 11B, the upper chucks 12A, 12B are arranged symmetrically with respect to the vertical plane extending in the Y direction (the front-and-rear direction) through the center of the suction holder 21 in plan view, and are provided to be movable in the X direction in a common horizontal plane. Each of the upper chucks 12A, 12B has two holding pieces that are configured to abut against two portions of the outer peripheral end of the substrate W and be capable of holding the outer peripheral end of the substrate W. The upper chuck drivers 14A, 14B move the upper chucks 12A, 12B such that the upper chucks 12A, 12B are closer to each other or farther away from each other.

As shown in FIG. 1, at a position near one side of the cup 61, the upper-surface cleaning device 70 is provided to be located in the vicinity of the upper holding device 10B in plan view. The upper-surface cleaning device 70 includes a rotation support shaft 71, an arm 72, a spray nozzle 73 and an upper-surface cleaning driver 74.

The rotation support shaft 71 is supported on the bottom surface portion 2*a* by the upper-surface cleaning driver 74 to extend in the up-and-down direction, and to be liftable, lowerable and rotatable. As shown in FIG. 2, at a position farther upward than the upper holding device 10B, the arm 72 is provided to extend in the horizontal direction from the upper end portion of the rotation support shaft 71. The spray nozzle 73 is attached to the tip portion of the arm 72.

An upper-surface cleaning fluid supplier 75 (FIG. 3) is connected to the spray nozzle 73. The upper-surface cleaning fluid supplier 75 supplies the cleaning liquid and gas to the spray nozzle 73. In the present embodiment, pure water is used as the cleaning liquid to be supplied to the spray nozzle 73, and an inert gas such as a nitrogen gas is used as the gas to be supplied to the spray nozzle 73. When the upper surface of the substrate W is cleaned, the spray nozzle 73 mixes the cleaning liquid and gas supplied from the upper-surface cleaning fluid supplier 75 to produce a fluid mixture, and injects the produced fluid mixture downwardly.

The upper-surface cleaning driver 74 includes one or a plurality of pulse motors, an air cylinder and the like, lifts and lowers the rotation support shaft 71 and rotates the rotation support shaft 71. With the above-mentioned configuration, on the upper surface of the substrate W held by suction and rotated by the suction holder 21, the spray nozzle 73 is moved in a circular arc shape. Thus, the entire upper surface of the substrate W can be cleaned.

As shown in FIG. 1, at a position near the other side of the cup 61, the end-portion cleaning device 80 is provided to be located in the vicinity of the upper holding device 10A in plan view. The end-portion cleaning device 80 includes a rotation support shaft 81, an arm 82, a bevel brush 83 and a bevel brush driver 84.

The rotation support shaft 81 is supported on the bottom surface portion 2*a* by the bevel brush driver 84 to extend in the up-and-down direction and to be liftable, lowerable and rotatable. As shown in FIG. 2, at a position farther upward than the upper holding device 10A, the arm 82 is provided to extend in the horizontal direction from the upper end portion of the rotation support shaft 81. At the tip portion of the arm 82, the bevel brush 83 is provided to project downwardly and to be rotatable about an axis extending in the up-and-down direction.

In the bevel brush 83, its upper half portion has an inverse trapezoidal shape, and its lower half portion has a trapezoidal shape. With this bevel brush 83, the outer peripheral end of the substrate W can be cleaned by the center portion in the up-and-down direction of the outer peripheral surface.

The bevel brush driver 84 includes one or a plurality of pulse motors, an air cylinder and the like, lifts and lowers the rotation support shaft 81 and rotates the rotation support shaft 81. With the above-mentioned configuration, the center portion of the outer peripheral surface of the bevel brush 83 is brought into contact with the outer peripheral end of the substrate W held by suction and rotated by the suction holder 21. Thus, the entire outer peripheral end of the substrate W can be cleaned.

Here, the bevel brush driver 84 further includes a motor built in the arm 82. The motor rotates the bevel brush 83 provided at the tip portion of the arm 82 about the axis extending in the up-and-down direction. Therefore, when the outer peripheral end of the substrate W is cleaned, a cleaning force of the bevel brush 83 in the outer peripheral end of the substrate W is improved by rotation of the bevel brush 83.

FIG. 3 is a block diagram showing the configuration of a control system of the substrate cleaning device 1. A control device 9 of FIG. 3 includes a CPU (Central Processing Unit), a RAM (Random Access Memory), a ROM (Read Only Memory) and a storage device. The RAM is used as a work area for the CPU. The ROM stores a system program. The storage device stores a control program.

As shown in FIG. 3, the control device 9 includes a chuck controller 9A, a suction controller 9B, a base controller 9C, a receiving-transferring controller 9D, a lower-surface cleaning controller 9E, a cup controller 9F, an upper-surface cleaning controller 9G, a bevel cleaning controller 9H and a carry-in carry-out controller 9I as functions. The functions of the control device 9 are implemented by execution of a substrate cleaning program stored in the storage device by the CPU. Part or all of the functions of the control device 9 may be implemented by hardware such as an electronic circuit.

The chuck controller 9A controls the lower chuck drivers 13A, 13B and the upper chuck drivers 14A, 14B in order to receive the substrate W that is carried into the substrate cleaning device 1 and hold the substrate W at a position above the suction holder 21. The suction controller 9B controls the suction holding driver 22 in order to hold the substrate W by suction and rotate the substrate W held by suction using the suction holder 21.

The base controller 9C controls the base driver 33 in order to move the mobile base 32 with respect to the substrate W held by the upper holding devices 10A, 10B. The receiving-transferring controller 9D controls the pin lifting-lowering driver 43 in order to move the substrate W between a height position of the substrate W held by the upper holding devices 10A, 10B and a height position of the substrate W held by the suction holder 21.

The lower-surface cleaning controller 9E controls the lower-surface brush rotation driver 55a, the lower-surface brush lifting-lowering driver 55b, the lower-surface brush movement driver 55c, the lower-surface cleaning liquid supplier 56 and the injection gas supplier 58 in order to clean the lower surface of the substrate W. Further, the lower-surface cleaning controller 9E controls the brush cleaning liquid supplier 57 to clean the lower-surface brush 51. The cup controller 9F controls the cup driver 62 in order to receive the cleaning liquid splashed from the substrate W using the cup 61 when the substrate W held by suction by the suction holder 21 is cleaned.

The upper-surface cleaning controller 9G controls the upper-surface cleaning driver 74 and the upper-surface cleaning fluid supplier 75 in order to clean the upper surface of the substrate W held by suction by the suction holder 21. The bevel cleaning controller 9H controls the bevel brush driver 84 in order to clean the outer peripheral end of the substrate W held by suction by the suction holder 21. The carry-in carry-out controller 9I controls the shutter driver 92 in order to open and close the inlet-outlet port 2x of the unit casing 2 when the substrate W is carried into and carried out from the substrate cleaning device 1.

(2) SCHEMATIC OPERATION OF SUBSTRATE CLEANING DEVICE

FIGS. 4 to 15 are schematic diagrams for explaining the schematic operation of the substrate cleaning device 1 of FIG. 1. In each of FIGS. 4 to 15, the plan view of the substrate cleaning device 1 is shown in the upper field. Further, the side view of the lower holding device 20 and its peripheral portions as viewed in the Y direction is shown in the middle field, and the side view of the lower holding device 20 and its peripheral portions as viewed in the X direction is shown in the bottom field. The side view i the middle field corresponds to the side view of the substrate cleaning device 1 taken along the line A-A of FIG. 1, and the side view in the bottom field corresponds to the side view of the substrate cleaning device 1 taken along the line B-B of FIG. 1. The expansion and contraction rates of part of the constituent elements are different for the plan view in the upper field and the side views in the middle and bottom fields in order to facilitate understanding of the shape and operation state of each constituent element in the substrate cleaning device 1. Further, in each of FIGS. 4 to 15, the cup 61 is indicated by the two-dots and dash lines, and the outer shape of the substrate W is indicated by the thick one-dot and dash lines.

In the initial state before the substrate W is carried into the substrate cleaning device 1, the inlet-outlet port 2x is closed by the shutter 91 of the opening-closing device 90. Further, as shown in FIG. 1, the lower chucks 11A, 11B are maintained in a state in which the distance between the lower chucks 11A, 11B is sufficiently larger than the diameter of the substrate W. Further, the upper chucks 12A, 12B are also maintained in a state in which the distance between the upper chucks 12A, 12B is sufficiently larger than the diameter of the substrate W.

Further, the mobile base 32 of the base device 30 is arranged such that the center of the suction holder 21 is located at the center of the cup 61 in plan view. The lower-surface cleaning device 50 is arranged in the proximal position on the mobile base 32. In the lifting-lowering supporter 54 of the lower-surface cleaning device 50, the cleaning surface (the upper end portion) of the lower-surface brush 51 is located farther downwardly than the suction holder 21. The position of the lower-surface brush 51 in this initial state is referred to as a waiting position. In a state where the substrate W is held by the suction holder 21, the waiting position is below the substrate W.

Further, in the receiving-transferring device 40, the plurality of support pins 41 are located farther downwardly than the suction holder 21. Further, in the cup device 60, the cup 61 is in the lower cup position. In the following description, the center position of the cup 61 in plan view is referred to as a plane reference position rp. Further, the position of the mobile base 32 located on the bottom surface portion 2a when the center of the suction holder 21 is in the plane reference position rp in plan view is referred to as a first horizontal position.

The substrate W is carried into the unit casing 2 of the substrate cleaning device 1. Specifically, the shutter 91 opens the inlet-outlet port 2x immediately before the substrate W is carried in. Thereafter, as indicated by the thick solid arrow a1 in FIG. 4, a hand (substrate holder) RH of a substrate transporting robot (not shown) carries the substrate W to the substantially center position in the unit casing 2 through the inlet-outlet port 2x. At this time, the substrate W held by the hand RH is located between the lower chuck 11A and the upper chuck 12A, and the lower chuck 11B and the upper chuck 12B as shown in FIG. 4.

Next, as indicated by the thick solid arrows a2 in FIG. 5, the lower chucks 11A, 11B move closer to each other such that a plurality of support pieces of the lower chucks 11A, 11B are located below the lower-surface peripheral portion of the substrate W. In this state, the hand RH is lowered and exits from the inlet-outlet port 2x. Thus, a plurality of portions of the lower-surface peripheral portion of the substrate W held by the hand RH are supported by the plurality of support pieces of the lower chucks 11A, 11B. After the hand RH exits, the shutter 91 closes the inlet-outlet port 2x.

Next, as indicated by the thick solid arrows a3 in FIG. 6, the upper chucks 12A, 12B move closer to each other such that a plurality of holding pieces of the upper chucks 12A, 12B abut against the outer peripheral end of the substrate W. The plurality of holding pieces of the upper chucks 12A, 12B abut against a plurality of portions of the outer peripheral end of the substrate W, whereby the substrate W supported by the lower chucks 11A, 11B is further held by the upper chucks 12A, 12B. Further, as indicated by the thick solid arrow a4 in FIG. 6, the mobile base 32 is moved forwardly from the first horizontal position such that suction holder 21 deviates from the plane reference position rp by a predetermined distance and the center of the lower-surface brush 51 is located at the plane reference position rp. At this time, the position of the mobile base 32 located on the bottom surface portion 2a is referred to as a second horizontal position.

Next, as indicated by the thick solid arrow a5 in FIG. 7, the lifting-lowering supporter 54 is lifted such that the cleaning surface of the lower-surface brush 51 located at the waiting position comes into contact with the lower-surface center region of the substrate W. The position of the lower-surface brush 51 at this time is referred to as a processing position. Further, as indicated by the thick solid arrow a6 in FIG. 7, the lower-surface brush 51 is rotated (spins) about the axis extending in the up-and-down direction. Thus, contaminants adhering to the lower-surface center region of the substrate W are physically stripped by the lower-surface brush 51.

In the bottom field in FIG. 7, an enlarged side view of a portion in which the lower-surface brush 51 come into contact with the lower surface of the substrate W is shown in a balloon. As shown in the balloon, with the lower-surface brush 51 in contact with the substrate W, the liquid nozzle 52 and the gas injector 53 are held at positions close to the lower surface of the substrate W. At this time, as indicated by the outlined arrow a51, the liquid nozzle 52 discharges the cleaning liquid toward the lower surface of the substrate W at a position in the vicinity of the lower-surface brush 51. Thus, the cleaning liquid that has been supplied to the lower surface of the substrate W from the liquid nozzle 52 is guided to the contact portion in which the lower-surface brush 51 and the substrate W come into contact with each other, whereby contaminants that have been removed from the back surface of the substrate W by the lower-surface brush 51 are washed away by the cleaning liquid. In this manner, in the lower-surface cleaning device 50, the liquid nozzle 52 is attached to the lifting-lowering supporter 54 together with the lower-surface brush 51. Thus, the cleaning liquid can be supplied efficiently to a portion to be cleaned in the lower surface of the substrate W by the lower-surface brush 51. Therefore, the consumption of the cleaning liquid is reduced, and excessive splashing of the cleaning liquid is suppressed.

In the bottom field in FIG. 7, an enlarged side view of a portion in which the lower-surface brush 51 come into contact with the lower surface of the substrate W is shown in a balloon. As shown in the balloon, with the lower-surface brush 51 in contact with the substrate W, the liquid nozzle 52 and the gas injector 53 are held at positions close to the lower surface of the substrate W. At this time, as indicated by the outlined arrow a51, the liquid nozzle 52 discharges the cleaning liquid toward the lower surface of the substrate W at a position in the vicinity of the lower-surface brush 51. Thus, the cleaning liquid that has been supplied to the lower surface of the substrate W from the liquid nozzle 52 is guided to the contact portion in which the lower-surface brush 51 and the substrate W come into contact with each other, whereby contaminants that have been removed from the back surface of the substrate W by the lower-surface brush 51 are washed away by the cleaning liquid. In this manner, in the lower-surface cleaning device 50, the liquid nozzle 52 is attached to the lifting-lowering supporter 54 together with the lower-surface brush 51. Thus, the cleaning liquid can be supplied efficiently to a portion to be cleaned in the lower surface of the substrate W by the lower-surface brush 51. Therefore, the consumption of the cleaning liquid is reduced, and excessive splashing of the cleaning liquid is suppressed.

Here, the upper surface 54u of the lifting-lowering supporter 54 is inclined downwardly in a direction away from the suction holder 21. In this case, in a case in which the cleaning liquid including contaminants falls on the lifting-lowering supporter 54 from the lower surface of the substrate W, the cleaning liquid received by the upper surface 54u is guided in a direction away from the suction holder 21.

Further, when the lower surface of the substrate W is cleaned by the lower-surface brush 51, the gas injector 53 injects gas toward the lower surface of the substrate W at a position between the lower-surface brush 51 and the suction holder 21 as indicated by the outlined arrow a52 in the balloon of FIG. 7. In the present embodiment, the gas injector 53 is attached onto the lifting-lowering supporter 54 such that the gas injection port extends in the X direction. In this case, when gas is injected to the lower surface of the substrate W from the gas injector 53, a strip-shaped gas curtain extending in the X direction is formed between the lower-surface brush 51 and the suction holder 21. Thus, when the lower surface of the substrate W is cleaned by the lower-surface brush 51, the cleaning liquid including contaminants is prevented from being splashed toward the suction holder 21. Thus, when the lower surface of the substrate W is cleaned by the lower-surface brush 51, the cleaning liquid including contaminants is prevented from adhering to the suction holder 21, and the suction surface of the suction holder 21 is maintained clean.

While the gas injector 53 injects gas obliquely upwardly toward the lower-surface brush 51 from the gas injector 53 as indicated by the outlined arrow a52 in the example of FIG. 7, the present invention is not limited to this. The gas injector 53 may inject gas in the Z direction toward the lower surface of the substrate W from the gas injector 53.

Next, in the state shown in FIG. 7, when the cleaning of the lower-surface center region of the substrate W is completed, the rotation of the lower-surface brush 51 is stopped, and the lifting-lowering supporter 54 is lowered such that the cleaning surface of the lower-surface brush 51 is spaced apart from the substrate W by a predetermined distance. Further, discharging of the cleaning liquid from the liquid nozzle 52 to the substrate W is stopped. At this time, the injection of gas from the gas injector 53 to the substrate W continues.

Thereafter, as indicated by the thick solid arrow a7 in FIG. 8, the mobile base 32 is moved rearwardly such that the suction holder 21 is located at the plane reference position rp. That is, the mobile base 32 is moved from the second horizontal position to the first horizontal position. At this time, injection of gas from the gas injector 53 to the substrate W continues, so that the lower-surface center region of the substrate W is sequentially dried by a gas curtain.

Next, as indicated by the thick solid arrow a8 in FIG. 9, the lifting-lowering supporter 54 is lowered such that the cleaning surface of the lower-surface brush 51 is located at a position farther downward than the suction surface (upper end portion) of the suction holder 21. Thus, the lower-surface brush 51 moves to the waiting position. Further, as indicated by the thick solid arrows a9 in FIG. 9, the upper chucks 12A, 12B move away from each other such that the plurality of holding pieces of the upper chucks 12A, 12B are spaced apart from the outer peripheral end of the substrate W. At this time, the substrate W is being supported by the lower chucks 11A, 11B.

Thereafter, as indicated by the thick solid arrow a10 in FIG. 9, the pin coupling member 42 is lifted such that the upper end portions of the plurality of support pins 41 are located slightly farther upwardly than the lower chucks 11A, 11B. Thus, the substrate W supported by the lower chucks 11A, 11B is received by the plurality of support pins 41.

Next, as indicated by the thick solid arrows a11 in FIG. 10, the lower chucks 11A, 11B move away from each other. At this time, the lower chucks 11A, 11B move to positions at which the lower chucks 11A, 11B do not overlap with the substrate W supported by the plurality of support pins 41 in plan view. Thus, both of the upper holding devices 10A, 10B return to the initial state.

Next, as indicated by the thick solid arrow a12 in FIG. 11, the pin coupling member 42 is lowered such that the upper end portions of the plurality of support pins 41 are located at positions farther downward than the suction holder 21. Thus, the substrate W supported on the plurality of support pins 41 is received by the suction holder 21. In this state, the suction holder 21 holds the lower-surface center region of the substrate W by suction. At the same time as the pin coupling member 42 is lowered or after the pin coupling member 42 is lowered, the cup 61 is lifted from the lower cup position to the upper cup position as indicated by the thick solid arrow a13 in FIG. 11.

Next, as indicated by the thick solid arrow a14 in FIG. 12, the suction holder 21 rotates about the axis extending in the up-and-down direction (an axial center of the rotation shaft of the suction holding driver 22). Thus, the substrate W held by suction by the suction holder 21 is rotated in a horizontal attitude.

Next, the rotation support shaft 71 of the upper-surface cleaning device 70 is rotated and lowered. Thus, as indicated by the thick solid arrow a15 in FIG. 12, the spray nozzle 73 is moved to a position above the substrate W, and the spray nozzle 73 is lowered such that the distance between the spray nozzle 73 and the substrate W is a predetermined distance. In this state, the spray nozzle 73 injects the fluid mixture of the cleaning liquid and gas to the upper surface of the substrate W. Further, the rotation support shaft 71 is rotated. Thus, as indicated by the thick solid arrow a16 in FIG. 12, the spray nozzle 73 is moved at a position above the rotating substrate W. The fluid mixture is injected to the entire upper surface of the substrate W, so that the entire upper surface of the substrate W is cleaned.

Further, when the upper surface of the substrate W is cleaned by the spray nozzle 73, the rotation support shaft 81 of the end-portion cleaning device 80 is rotated and lowered. Thus, as indicated by the thick solid arrow a17 in FIG. 12, the bevel brush 83 is moved to a position above the outer peripheral end of the substrate W. Further, the bevel brush 83 is lowered such that the center portion of the outer peripheral surface of the bevel brush 83 comes into contact with the outer peripheral end of the substrate W. In this state, the bevel brush 83 is rotated (spins) about the axis extending in the up-and-down direction. Thus, contaminants adhering to the outer peripheral end of the substrate W are physically stripped by the bevel brush 83. The contaminants that have been stripped from the outer peripheral end of the substrate W are washed away by the cleaning liquid of the fluid mixture injected from the spray nozzle 73 to the substrate W.

Further, when the upper surface of the substrate W is cleaned by the spray nozzle 73, the lifting-lowering supporter 54 is lifted such that the cleaning surface of the lower-surface brush 51 located at the waiting position comes into contact with the lower-surface outer region of the substrate W. Thus, the lower-surface brush 51 moves to the processing position. Further, as indicated by the thick solid arrow a18 in FIG. 12, the lower-surface brush 51 is rotated (spins) about the axis extending in the up-and-down direction. Further, the liquid nozzle 52 discharges the cleaning liquid toward the lower surface of the substrate W, and the gas injector 53 injects the gas toward the lower surface of the substrate W. Thus, it is possible to clean the entire lower-surface outer region of the substrate W held by suction and rotated by the suction holder 21 using the lower-surface brush 51.

The rotation direction of the lower-surface brush 51 may be opposite to the rotation direction of the suction holder 21. In this case, the lower-surface outer region of the substrate W can be cleaned efficiently. In a case in which the lower-surface brush 51 is not relatively large, the movement supporter 55 may advance and retreat between the proximal position and the distal position on the mobile base 32 as indicated by the thick solid arrow a19 in FIG. 12. Even in this case, it is possible to clean the entire lower-surface outer region of the substrate W held by suction and rotated by the suction holder 21 using the lower-surface brush 51.

While it requires a relatively long period of time to clean the upper surface of the substrate W with use of the spray nozzle 73 in the present embodiment, it is possible to clean the lower-surface outer region of the substrate W using the relatively large lower-surface brush 51 in a relatively short period of time. As such, during a period in which the upper surface of the substrate W is cleaned, cleaning of the lower-surface outer region of the substrate W with use of the above-mentioned lower-surface brush 51 and cleaning of the lower-surface brush 51 with use of the liquid nozzles 52a, 52b of FIG. 1 are alternately performed. Details of an operation of cleaning the lower-surface brush 51 in FIG. 12 will be described below.

Next, when cleaning of the upper surface, the outer peripheral end and the lower-surface outer region of the substrate W is completed, injection of a fluid mixture from the spray nozzle 73 to the substrate W is stopped. Further, as indicated by the thick solid arrow a20 in FIG. 13, the spray nozzle 73 is moved to a position near one side of the cup 61 (the position in the initial state). Further, as indicated by the thick solid arrow a21 in FIG. 13, the bevel brush 83 is moved to a position near the other side of the cup 61 (the position in the initial state). Further, the rotation of the lower-surface brush 51 is stopped, and the lifting-lowering supporter 54 is lowered such that the cleaning surface of the lower-surface brush 51 is spaced apart from the substrate W by a predetermined distance. Thus, the lower-surface brush 51 moves to the waiting position. Further, the discharging of the cleaning liquid from the liquid nozzle 52 to the substrate W and the injection of gas from the gas injector 53 to the substrate W are stopped. In this state, the suction holder 21 is rotated at a high speed, so that the cleaning liquid adhering to the substrate W is shaken off, and the entire substrate W is dried.

Next, as indicated by the thick solid arrow a22 in FIG. 14, the cup 61 is lowered from the upper cup position to the lower cup position. Further, as indicated by the thick solid arrows a23 in FIG. 14, the lower chucks 11A, 11B move close to each other to a position at which the lower chucks 11A, 11B can support a new substrate W in preparation for the new substrate W being carried into the unit casing 2.

Finally, the substrate W is carried out from the unit casing 2 of the substrate cleaning device 1. Specifically, the shutter 91 opens the inlet-outlet port 2x immediately before the substrate W is carried out. Thereafter, as indicated by the thick solid arrow a24 in FIG. 15, the hand (substrate holder) RH of the substrate transferring robot (not shown) enters the unit casing 2 through the inlet-outlet port 2x. Subsequently, the hand RH receives the substrate W on the suction holder 21 and exits from the inlet-outlet port 2x. After the hand RH exits, the shutter 91 closes the inlet-outlet port 2x.

(3) OPERATION OF CLEANING LOWER-SURFACE BRUSH

Figure 16:
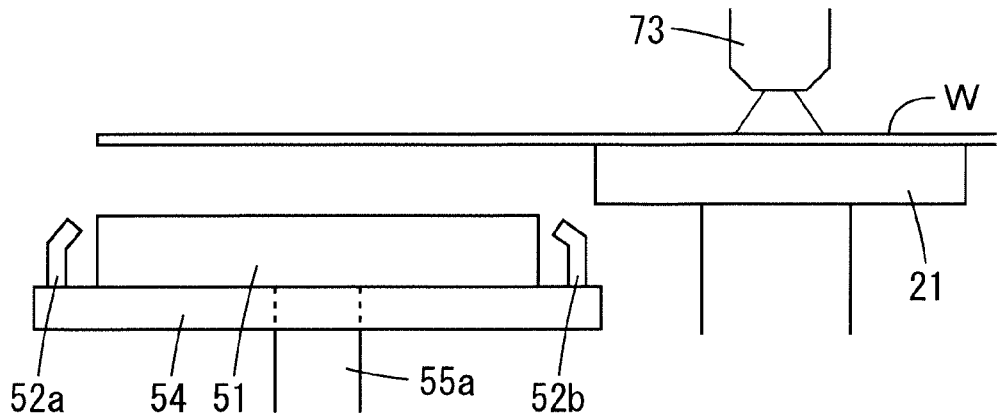
FIG. 16 is a schematic diagram for explaining the schematic operation of the substrate cleaning device in FIG. 12.

FIGS. 16 to 21 are schematic diagrams for explaining the schematic operation of the substrate cleaning device 1 in FIG. 12. As shown in FIG. 16, when the upper surface of the substrate W of FIG. 12 is cleaned, the suction holder 21 rotates about the axis extending in the up-and-down direction while holding the substrate W by suction, and the spray nozzle 73 is moved to a position substantially above the center of the substrate W. In this state, the fluid mixture of the cleaning liquid and gas is injected from the spray nozzle 73 to the upper surface of the substrate W.

Further, cleaning of the outer peripheral end of the substrate W with use of the bevel brush 83 of FIG. 12 is started. At this time, suppose that the contamination rate of the lower-surface outer region of the substrate W is 100%, and the contamination rate of the lower-surface brush 51 is 0%. Here, a contamination rate is an index that indicates how low cleanliness is. A high contamination rate means low cleanliness.

Figure 17:
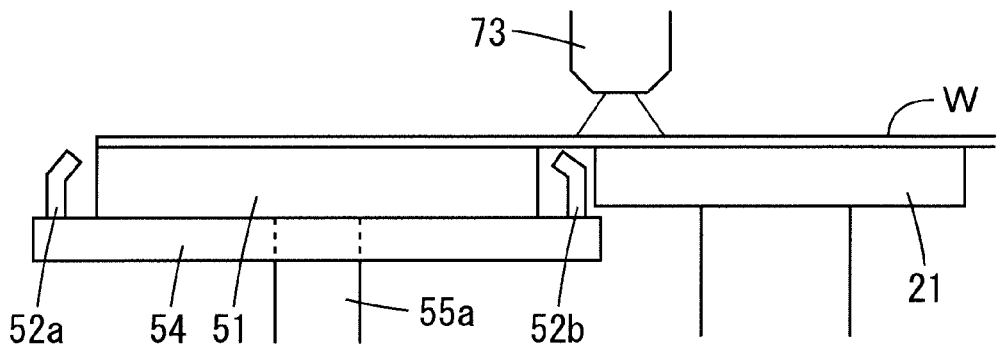
FIG. 17 is a schematic diagram for explaining the schematic operation of the substrate cleaning device in FIG. 12.

Next, as shown in FIG. 17, the spray nozzle 73 is moved outwardly above the rotating substrate W. This movement of the spray nozzle 73 continues until the spray nozzle 73 arrives at a position above the outer periphery of the substrate W. Further, the lower-surface brush 51 is lifted from the waiting position to the processing position above the waiting position while rotating such that the cleaning surface of the lower-surface brush 51 comes into contact with the lower-surface outer region of the substrate W. Further, the cleaning liquid is discharged to the lower surface of the substrate W from the liquid nozzle 52 of FIG. 12. Thus, the lower-surface outer region of the substrate W is cleaned. When the lower-surface outer region of the substrate W is cleaned, gas is injected from the gas injector 53 of FIG. 12 toward the lower surface of the substrate W.

Suppose that contaminants equivalent to the contamination rate of 60%, for example, are transferred to the lower-surface brush 51 in the operation of cleaning the lower-surface outer region of the substrate W of FIG. 17. Further, suppose that contaminants equivalent to the contamination rate of 20%, for example, out of the contaminants that have adhered to the substrate W are washed away by the cleaning liquid. In this case, the contamination rate of the lower-surface outer region of the substrate W decreases to 20%, and the contamination rate of the lower-surface brush 51 increases to 60%.

Figure 18:
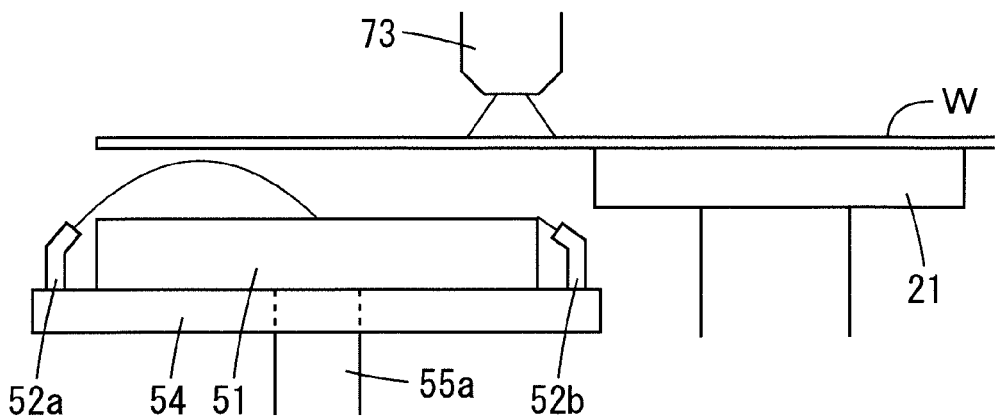
FIG. 18 is a schematic diagram for explaining the schematic operation of the substrate cleaning device in FIG. 12.

Next, as shown in FIG. 18, the lower-surface brush 51 is lowered from the processing position to the waiting position below the processing position while rotating such that the cleaning surface of the lower-surface brush 51 is spaced apart from the lower-surface outer region of the substrate W. Further, at the waiting position, the cleaning liquid is discharged toward the center portion of the cleaning surface of the lower-surface brush 51 from the liquid nozzle 52a, and the cleaning liquid is discharged from the liquid nozzle 52b to the end portion of the cleaning surface of the lower-surface brush 51. Thus, the lower-surface brush 51 is cleaned.

Since the lower-surface brush 51 is located below the substrate W, the cleaning liquid discharged to the lower-surface brush 51 falls due to gravity. In this case, because the cleaning liquid does not splash around the lower-surface brush 51, it is possible to prevent the cleaning liquid from adversely affecting the cleaning of the substrate W. In the present example, the cleaning liquid that has been discharged from the liquid nozzle 52a is supplied parabolically to the center portion of the cleaning surface of the lower-surface brush 51 from a position obliquely upward of the lower-surface brush 51. Ultrasonic cleaning may be combined to clean the lower-surface brush 51.

Suppose that, in the operation of cleaning the lower-surface brush 51 of FIG. 18, contaminants equivalent to the contamination rate of 20%, for example, out of the contaminants that have adhered to the lower-surface brush 51 are washed away by the cleaning liquid. In this case, the contamination rate of the lower-surface outer region of the substrate W remains at 20%, and the contamination rate of the lower-surface brush 51 decreases to 40%.

Figure 19:
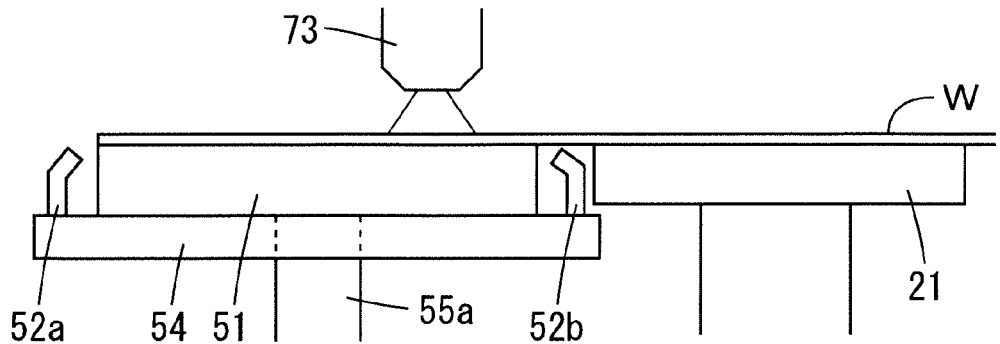
FIG. 19 is a schematic diagram for explaining the schematic operation of the substrate cleaning device in FIG. 12.

Subsequently, as shown in FIG. 19, the lower-surface brush 51 is lifted from the waiting position to the processing position above the waiting position while rotating such that the cleaning surface of the lower-surface brush 51 comes into contact with the lower-surface outer region of the substrate W. Thus, the lower-surface outer region of the substrate W is cleaned again. The operation of cleaning the lower-surface outer region of the substrate W in FIG. 19 is similar to the operation of cleaning the lower-surface outer region of the substrate W in FIG. 17.

In the operation of cleaning the lower-surface outer region of the substrate W of FIG. 19, contaminants are transferred between the lower-surface outer region of the substrate W and the lower-surface brush 51. However, as a current point in time, the contamination rate of the lower-surface brush 51 is higher than the contamination rate of the lower-surface outer region of the substrate W. Therefore, an amount of contaminants to be transferred from the lower-surface brush 51 to the lower-surface outer region of the substrate W is larger than an amount of contaminants to be transferred from the lower-surface outer region of the substrate W to the lower-surface brush 51. Therefore, the contaminants that have adhered to the lower-surface brush 51 are virtually transferred to the lower-surface outer region of the substrate W.

Suppose that contaminants equivalent to the contamination rate of 20%, for example, out of the contaminants that have adhered to the lower-surface brush 51 are transferred to the lower-surface outer region of the substrate W. Further, suppose that contaminants equivalent to the contamination rate of 20%, for example, are washed away by the cleaning liquid. In this case, the contamination rate of the lower-surface outer region of the substrate W remains at 20%, and the contamination rate of the lower-surface brush 51 decreases to 20%.

Figure 20:
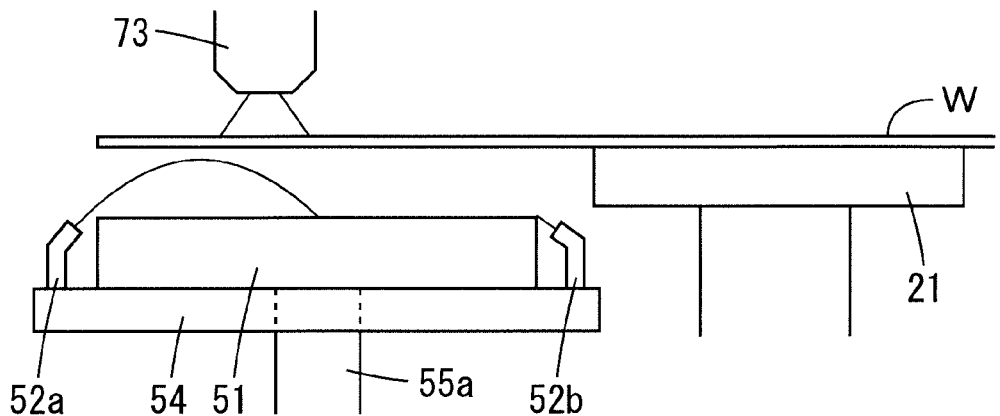
FIG. 20 is a schematic diagram for explaining the schematic operation of the substrate cleaning device in FIG. 12.

Thereafter, as shown in FIG. 20, the lower-surface brush 51 is lowered from the processing position to the waiting position below the processing position while rotating such that the cleaning surface of the lower-surface brush 51 moves away from the lower-surface outer region of the substrate W. Thus, the lower-surface brush 51 is cleaned again. The operation of cleaning the lower-surface brush 51 in FIG. 20 is similar to the operation of cleaning the lower-surface brush 51 in FIG. 18.

Suppose that, in the operation of cleaning the lower-surface brush 51 of FIG. 20, contaminants equivalent to the contamination rate of 20%, for example, out of the contaminants that have adhered to the lower-surface brush 51 are washed away by the cleaning liquid. In this case, the contamination rate of the lower-surface outer region of the substrate W remains at 20%, and the contamination rate of the lower-surface brush 51 decreases to 0%.

The operation of cleaning the lower-surface outer region of the substrate W in FIG. 19 and the operation of cleaning the lower-surface brush 51 in FIG. 20 are repeated. In this case, in the operation of cleaning the lower-surface outer region of the substrate W, contaminants are transferred between the lower-surface outer region of the substrate W and the lower-surface brush 51. Here, at a current point in time, the contamination rate of the lower-surface outer region of the substrate W is higher than the contamination rate of the lower-surface brush 51. Therefore, the contaminants that have adhered to the lower-surface outer region of the substrate W are virtually transferred to the lower-surface brush 51. Thus, the contamination rate of the lower-surface outer region of the substrate W decreases.

Further, in the operation of cleaning the lower-surface outer region of the substrate W, even in a case in which the contamination rate of the lower-surface brush 51 increases, the contamination rate of the lower-surface brush 51 is decreased by the subsequent operation of cleaning the lower-surface brush 51. Therefore, it is possible to make the contamination rate of the lower-surface outer region of the substrate W and the contamination rate of the lower-surface brush 51 be 0% by repeating the operation of cleaning the lower-surface outer region of the substrate W and the operation of cleaning the lower-surface brush 51. Further, because the operation of cleaning the lower-surface outer region of the substrate W and the operation of cleaning the lower-surface brush 51 are repeated during a period in which the upper surface of the substrate W is cleaned, the throughput is not reduced.

Figure 21:
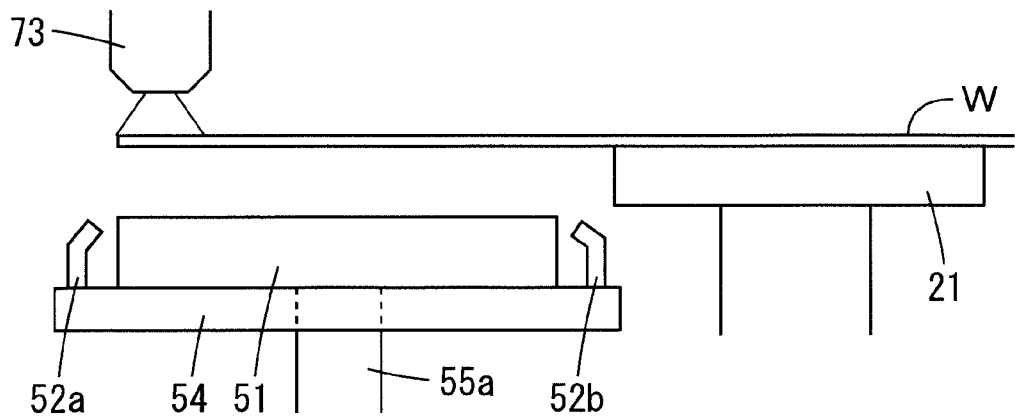
FIG. 21 is a schematic diagram for explaining the schematic operation of the substrate cleaning device in FIG. 12.

Finally, as shown in FIG. 21, the spray nozzle 73 arrives at a position above the outer periphery of the substrate W. When injection of the fluid mixture from the spray nozzle 73 to the substrate W is stopped, cleaning of the upper surface of the substrate W ends. Further, when the rotation of the lower-surface brush 51 is stopped, and the lower-surface brush 51 is moved to the waiting position, the cleaning of the lower-surface outer region of the substrate W and the cleaning of the lower-surface brush 51 end.

While the cleaning liquid used to clean the lower-surface brush 51 is pure water in the present embodiment, the embodiment is not limited to this. The cleaning liquid used to clean the lower-surface brush 51 may be warm water, functional water, thin alkaline water or a chemical liquid. In a case in which the cleaning liquid is a chemical liquid, the type of a chemical liquid may be suitably changed in accordance with the type of contaminants to be removed.

While the liquid nozzles 52a, 52b stop discharging the cleaning liquid when the lower-surface brush 51 is in the processing position, the embodiment is not limited to this. The liquid nozzles 52a, 52b may also discharge the cleaning liquid when the lower-surface brush 51 is in the processing position, that is, while the lower-surface outer region of the substrate W is being cleaned. In this case, the liquid nozzles 52a, 52b may be used as nozzles that discharge the cleaning liquid to the lower-surface center portion of the substrate W. Further, the liquid nozzles 52a, 52b may discharge the cleaning liquid even during a period in which the lower-surface brush 51 is lifted and lowered between the waiting position and the processing position.

(4) EFFECTS

In the substrate cleaning device 1 according to the present embodiment, the lower-surface brush 51 comes into contact with the lower surface of the substrate W while rotating at the processing position, so that the lower surface of the substrate W is cleaned. Further, even in a case in which the lower-surface brush is contaminated due to cleaning of the lower surface of the substrate W, the cleaning liquid is discharged by each of the liquid nozzles 52a, 52b to the center portion and the end portion of the rotating lower-surface brush 51 at the waiting position. With this configuration, it is possible to clean the entire lower-surface brush 51.

Further, because the waiting position of the lower-surface brush 51 overlaps with the substrate W held by the suction holder 21 in the up-and-down direction, the footprint hardly increases even in a case in which the lower-surface brush 51 is relatively large. Therefore, it is possible to clean the lower surface of the substrate W in a short period of time by using the relatively large lower-surface brush 51. Therefore, even in a case in which the step of cleaning the lower-surface brush 51 is provided, the throughput hardly changes. Thus, it is possible to maintain the cleanliness of the lower-surface brush 51 without a reduction in throughput.

Further, the lower-surface brush 51 is supported by the lifting-lowering supporter 54, and each of the liquid nozzles 52a, 52b is attached to the lifting-lowering supporter 54 such that the outlet port of the cleaning liquid is directed obliquely upwardly in the vicinity of the lower-surface brush 51. In this case, it is possible to easily clean the lower-surface brush 51 without interfering with cleaning of the lower surface of the substrate W by the lower-surface brush 51. In particular, the liquid nozzle 52a discharges the cleaning liquid such that the cleaning liquid is supplied parabolically to the center portion of the lower-surface brush 51 from a position obliquely upward of the lower-surface brush 51. Thus, it is possible to easily clean the center portion of the lower-surface brush 51 without interfering with cleaning of the lower surface of the substrate W by the lower-surface brush 51.

(5) OTHER EMBODIMENTS (a) While the lower-surface outer region of the substrate W and the lower-surface brush 51 are cleaned in the lower holding device 20 after the lower-surface center region of the substrate W is cleaned in the upper holding devices 10A, 10B in the above-mentioned embodiment, the embodiment is not limited to this. The lower-surface center region of the substrate W may be cleaned in the upper holding devices 10A, 10B after the lower-surface outer region of the substrate W and the lower-surface brush 51 are cleaned in the lower holding device 20. Further, the lower-surface center region of the substrate W does not have to be cleaned. In this case, the substrate cleaning device 1 does not include the upper holding device 10A, 10B or the receiving-transferring device 40.

(b) While the upper surface of the substrate W is cleaned with use of the spray nozzle 73 in the above-mentioned embodiment, the embodiment is not limited to this. The upper surface of the substrate W may be cleaned with use of a brush or may be cleaned with use of a rinse nozzle that discharges a rinse liquid. Further, the upper surface of the substrate W does not have to be cleaned. In this case, the substrate cleaning device 1 does not include the upper-surface cleaning device 70. Similarly, the outer peripheral end of the substrate W does not have to be cleaned. In this case, the substrate cleaning device 1 does not include the end-portion cleaning device 80.

(c) While the substrate cleaning device 1 includes the control device 9 in the above-mentioned embodiment, the embodiment is not limited to this. In a case in which being configured to be controllable by an external information processing apparatus, the substrate cleaning device 1 does not have to include the control device 9.

(d) While the lower-surface outer region of the substrate W is cleaned multiple times at the processing position and the lower-surface brush 51 is cleaned multiple times at the waiting position in the above-mentioned embodiment, the embodiment is not limited to this. The cleaning of the lower-surface outer region of the substrate W at the processing position or the cleaning of the lower-surface brush 51 at the waiting position does not have to be repeated.

(6) CORRESPONDENCE RELATIONSHIP BETWEEN RESPECTIVE COMPONENTS OF CLAIMS AND RESPECTIVE PORTIONS OF EMBODIMENTS

In the following paragraphs, non-limiting examples of correspondences between various elements recited in the claims below and those described above with respect to various preferred embodiments of the present invention are explained. As each of various elements recited in the claims, various other elements having configurations or functions described in the claims can be also used.

In the above-mentioned embodiment, the substrate W is an example of a substrate, the suction holder 21 is an example of a substrate holder, the lower-surface brush 51 is an example of a lower-surface brush, the liquid nozzles 52a, 52b are examples of first and second liquid nozzles, respectively, the substrate cleaning device 1 is an example of a substrate cleaning device, and the lifting-lowering supporter 54 is an example of a supporter.

The invention claimed is:

1. A substrate cleaning device comprising:
 a substrate holder that holds a substrate in a horizontal attitude;
 a lower-surface brush that is configured to be movable between a processing position for cleaning of the substrate and a waiting position that overlaps with the substrate held by the substrate holder in an up-and-down direction and rotatable about an axis extending in the up-and-down direction, and cleans a lower surface of the substrate by coming into contact with the lower surface of the substrate;
 a first liquid nozzle that discharges a cleaning liquid to a center portion of the lower-surface brush, at the waiting position; and
 a second liquid nozzle that discharges a cleaning liquid to an end portion of the lower-surface brush, at the waiting position.

2. The substrate cleaning device according to claim 1, further comprising a supporter that supports the lower-surface brush, wherein each of the first liquid nozzle and the second liquid nozzle is attached to the supporter such that a discharge port of the cleaning liquid is directed obliquely upwardly.

3. The substrate cleaning device according to claim 1, wherein the first liquid nozzle discharges the cleaning liquid such that the cleaning liquid is supplied parabolically to the center portion of the lower-surface brush from a position obliquely upward of the lower-surface brush.

4. The substrate cleaning device according to claim 1, wherein the lower-surface brush is formed of a fluorine-based resin.

5. The substrate cleaning device according to claim 1, wherein each of the substrate holder and the lower-surface brush is circular, and a diameter of the lower-surface brush is larger than a diameter of the substrate holder.

6. The substrate cleaning device according to claim 1, wherein each of the substrate and the lower-surface brush is circular, and a diameter of the lower-surface brush is larger than ⅓ of a diameter of the substrate.

* * * * *